US 9,299,333 B2

United States Patent
Su et al.

(10) Patent No.: US 9,299,333 B2
(45) Date of Patent: Mar. 29, 2016

(54) SYSTEM FOR ADAPTIVE AUDIO SIGNAL SHAPING FOR IMPROVED PLAYBACK IN A NOISY ENVIRONMENT

(71) Applicant: QoSound, Inc., Irvine, CA (US)

(72) Inventors: Huan-Yu Su, Irvine, CA (US); Anthony Jiming Su, Irvine, CA (US)

(73) Assignee: QOSOUND, INC, Irvine, CA (US)

( * ) Notice: Subject to any disclaimer, the term of this patent is extended or adjusted under 35 U.S.C. 154(b) by 264 days.

(21) Appl. No.: 13/975,345

(22) Filed: Aug. 25, 2013

(65) Prior Publication Data

US 2014/0064508 A1    Mar. 6, 2014

Related U.S. Application Data

(60) Provisional application No. 61/697,807, filed on Sep. 7, 2012, provisional application No. 61/696,216, filed on Sep. 2, 2012.

(51) Int. Cl.

| | |
|---|---|
| H04R 3/02 | (2006.01) |
| G10K 11/16 | (2006.01) |
| G10K 11/00 | (2006.01) |
| G10L 15/20 | (2006.01) |
| G10L 21/0208 | (2013.01) |
| G10L 21/02 | (2013.01) |
| H03G 3/30 | (2006.01) |
| H03G 3/32 | (2006.01) |

(Continued)

(52) U.S. Cl.
CPC .............. *G10K 11/002* (2013.01); *G10K 11/16* (2013.01); *G10L 15/20* (2013.01); *G10L 21/02* (2013.01); *G10L 21/0208* (2013.01); *H03G 3/3089* (2013.01); *H03G 3/32* (2013.01); *H03G 9/005* (2013.01); *H03G 9/025* (2013.01); *H04R 3/02* (2013.01)

(58) Field of Classification Search
CPC .......... H03G 3/32; H03G 9/025; G10L 15/20; G10L 21/0208; G10L 21/0216; H04M 1/19; H04M 1/1083
USPC .............. 381/57, 71.1, 71.6, 71.12, 73.1, 94.1
See application file for complete search history.

(56) References Cited

U.S. PATENT DOCUMENTS

| | | | |
|---|---|---|---|
| 5,450,494 | A | 9/1995 | Okubo et al. |
| 5,459,813 | A | 10/1995 | Klayman |
| 5,796,847 | A | 8/1998 | Kaihotsu et al. |

(Continued)

FOREIGN PATENT DOCUMENTS

EP    2 244 254 A1    10/2010

*Primary Examiner* — Thomas Alunkal
(74) *Attorney, Agent, or Firm* — Keith Kind

(57) ABSTRACT

Provided is a system for adaptively enhancing an end-user's perceived quality, or quality of experience (QoE), of speech and other audio under ambient noise conditions. The system comprises the steps of determining the ambient noise characteristics on a continuous basis to capture the time varying nature of ambient noises, and adaptively determining the most optimal signal shaping to be applied to the audio/speech signal to produce the most appropriate enhancement to compensate for the ambient noise impairment. The system also comprises a signal shaping technique by using an infinite impulse response (IIR) filter that performs the signal modification with a low delay; a multi-level automatic gain control (AGC); and a controlled amplitude clipping module that assures samples are below a certain limit; and outputs the modified signal for playback through a loudspeaker or the like.

16 Claims, 18 Drawing Sheets

(51) Int. Cl.
*H03G 9/00* (2006.01)
*H03G 9/02* (2006.01)

(56) References Cited

U.S. PATENT DOCUMENTS

| | | | |
|---|---|---|---|
| 6,993,480 B1 | 1/2006 | Klayman | |
| 7,031,460 B1* | 4/2006 | Zheng | G10K 11/1782 379/406.06 |
| 7,092,514 B2* | 8/2006 | Trump | H03G 3/32 379/390.03 |
| 7,349,353 B2* | 3/2008 | Guduru | H04B 3/237 370/286 |
| 7,577,248 B2* | 8/2009 | McCree | H04M 9/082 379/406.08 |
| 8,204,742 B2* | 6/2012 | Yang | G10L 21/0208 704/209 |
| 2004/0057586 A1* | 3/2004 | Licht | H03G 3/32 381/94.7 |
| 2004/0143433 A1 | 7/2004 | Marumoto et al. | |
| 2005/0013443 A1 | 1/2005 | Marumoto et al. | |
| 2008/0232612 A1* | 9/2008 | Tourwe | H03G 9/005 381/99 |
| 2009/0281800 A1* | 11/2009 | LeBlanc | G10L 21/0208 704/224 |
| 2009/0287496 A1* | 11/2009 | Thyssen | H03G 7/007 704/500 |
| 2010/0046767 A1* | 2/2010 | Bayley | G01H 3/14 381/59 |
| 2010/0246849 A1* | 9/2010 | Sudo | H03G 3/32 381/94.1 |
| 2011/0007907 A1* | 1/2011 | Park | G10K 11/178 381/71.8 |
| 2011/0293103 A1 | 12/2011 | Park et al. | |
| 2012/0140917 A1* | 6/2012 | Nicholson | G10K 11/1782 379/392.01 |
| 2013/0259250 A1* | 10/2013 | Nicholson | G10K 11/1782 381/71.6 |

* cited by examiner

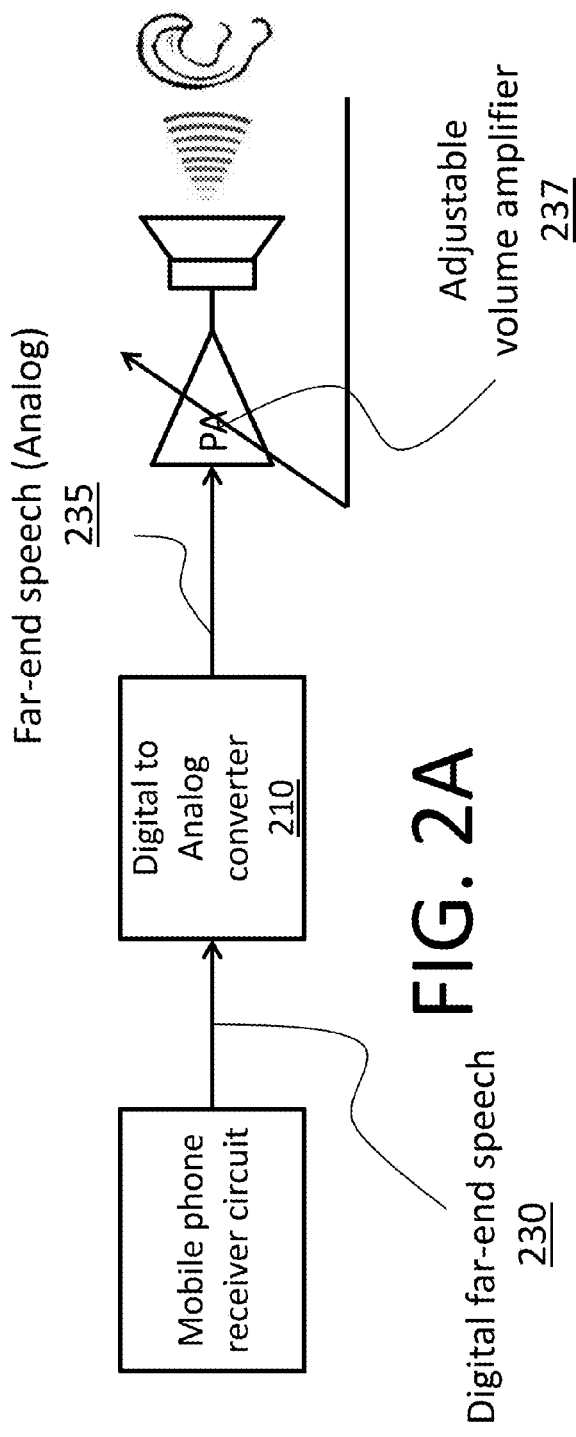
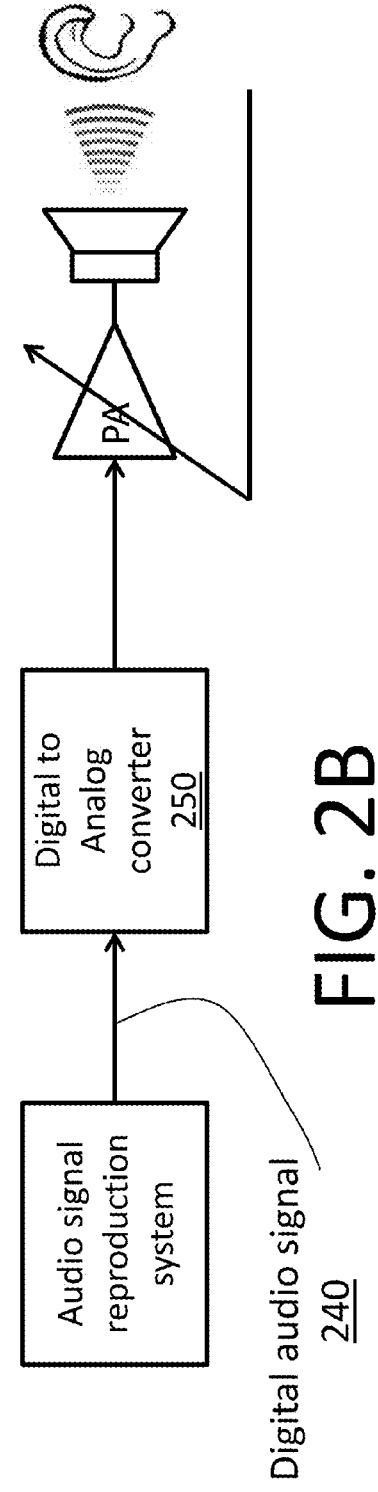

SYSTEM FOR ADAPTIVE AUDIO SIGNAL SHAPING FOR IMPROVED PLAYBACK IN A NOISY ENVIRONMENT

CROSS REFERENCE TO OTHER APPLICATIONS

The present application for patent claims priority to Provisional Application No. 61/696,216 entitled "AUDIO PLAYBACK SYSTEM WITH ADAPTIVE SIGNAL SHAPING" filed on Sep. 2, 2012, by Anthony J. Su and Provisional Application No. 61/697,807 entitled "USE OF IIR FILTER FOR LOW DELAY ADAPTIVE SIGNAL SHAPING" filed on Sep. 7, 2012, by Anthony J. Su. The above referenced provisional patent applications are incorporated herein by reference as if set forth in full.

FIELD OF THE INVENTION

The present invention is related to audio signal processing and more specifically to system for improving audio quality playback in a noisy environment.

BACKGROUND OF THE INVENTION

For as long as mobile phones have existed, mobile phone users have suffered from a typical problem. When users have phone conversations in a noisy environment, such as a moving car, a noisy bar or the like, it is very difficult to understand the other party. This is true even if the other party is in a quiet environment and is actually producing very high quality speech signals. The reason for this difficulty is that the human auditory system requires that an audio or speech signal is above a certain signal level relative to the ambient noise in order to achieve a minimum required intelligibility. Furthermore, it's generally understood in the art, that in order to feel comfortable with the conversation, humans require an even higher signal level that is well above the ambient noise level. While those qualitative terms are not easily quantifiable, this phenomenon can be easily demonstrated. For example, users will generally increase the volume of a radio system in a high velocity moving automobile in order to make them feel comfortable, even though such a volume would usually be perceived as being much too high when the car is stationary. Also, people will often shout at each other in a noisy environment in order to be able to hear their conversation over the ambient noise, when such a volume level would be much higher than the volume level of the same conversation taking place in a quieter environment.

From a user's perspective, mobile phones are designed and manufactured to maintain certain "fidelity" in reproducing the sound quality from a far-end caller. This fidelity assumes the user is carrying out the conversation in a relatively quiet environment such as in a home or office. Indeed, the Telecommunication Standardization Sector of International Telecommunication Union (ITU-T) defines a signal to noise ratio (SNR) of 20 dB or 15 dB as their "noisy" environment test condition for standardizing voice compression algorithms for use in telecom equipment, such as mobile phones. Unfortunately, in real life application scenarios, such a condition is not always guaranteed, and users often need to carry out conversations under much noisier conditions, and the perceived quality or quality of experience (QoE) is unquestionably deteriorated. Users' sole option today is to increase the volume of their mobile phones to the maximum, and if that still does not allow for a reasonable conversation to occur, they usually terminate the call prematurely as an unwanted consequence of this condition.

In the personal infotainment/communication industry, portable handheld products like the Apple iPod®, iPad®, Nintendo DS®, and Sony PSP® cause end-user's to suffer from the same ambient noise impairment that lowers their perceived QoE, as described above. When the ambient noise level is high, a user's only option presently is to increase the playback volume of the sound to the maximum capability of the device. Not only is this uncomfortable, but may also be harmful because young children, who are most likely to use this type of equipment, can suffer permanent damage to their developing auditory systems by constantly increasing the playback volume to the maximum capacity when in such noisy environments.

Accordingly, there is an intense need for a system that can perform the desired result of increasing a user's QoE in a noisy environment without necessarily resorting to simple volume increases.

BRIEF SUMMARY OF THE INVENTION

The present invention overcomes deficiencies found in the prior art by providing a system and method that improves a user's QOE in a noisy environment by adaptively modifying the audio/speech signal by means of signal shaping techniques applied both at the volume level as well as at the spectrum level to compensate for the impairment caused by ambient noises. In a preferred embodiment of the present invention, an Infinite Impulse Response (IIR) filter is used to achieve a spectrum/gain shaping. This has the advantage of having a very low delay, which is ideal for mobile phone applications and the like. In other embodiments, different signal shaping techniques can be used, such as Fast Fournier Transform (FFT) based frequency domain manipulations, or Finite Impulse Response (FIR) filtering. These alternative techniques can be used, especially in cases, such as audio music systems and the like, where delays are not considered as critical. However, any signal spectrum shaping technique can be used without departing from the scope and breadth of the present invention. Also, due to signal level variations, the use of a multi-level automatic gain control (AGC) can further preserve the intelligibility of certain low level signals by applying an appropriate gain, together with a carefully designed clipping control technique.

In one example, the present invention can be used to improve a user's perceived quality of experience from a mobile phone or infotainment device by means of an adaptive signal shaping technique with low delay. The shaping technique is applied to the far-end-speech signal or locally reproduced-audio signal, based on the near-end ambient noise characteristics that occur prior to the aforementioned far-end-speech or locally reproduced-audio signal's playback through the loudspeaker or earphone. It is also anticipated that this technique can be used in any application where users may be listening to an audio signal in a noisy environment such as a stereo system in an automobile, a broadcasting system in a train or aircraft or the like. As used herein, the term "far-end audio signal" refers to either a far-end speech signal or a locally produced audio signal, such as from an infotainment device or an mp3 player or the like.

In one embodiment of the present invention, the adaptive signal shaping technique modifies the received far-end-speech or locally reproduced-audio signal's volume and/or spectrum depending on the ambient noise characteristics, such as volume and/or type of noise, i.e. stationary noise, such as the noise encountered in a moving vehicle, or rapidly varying noise, such as the noise encountered in a street, airport, noisy restaurant or other loud public environment.

In one aspect of the present invention, the modification to the signal is performed by an adaptively selected shaping filter with a desired spectrum shape from a pre-stored set of shaping filters. One example of such pre-stored shaping filters are of the form called IIR filters. In accordance with the present invention, an IIR filter can deliver certain suitable spectrum and/or gain modification capabilities with a very short delay increase to the signal path, therefore achieving a low delay signal shaping. Also, in order to preserve intelligibility of certain low level signals, a multi-level AGC is employed in one exemplary embodiment of the present invention, together with a carefully designed signal clipping technique.

Other aspects of the present invention will become apparent with further reference to the drawings and specification, which follow.

BRIEF DESCRIPTION OF THE DRAWINGS

FIGS. 2A/2B highlight more detailed exemplary audio/speech reproduction flowcharts of a mobile phone and an audio playback system.

DETAILED DESCRIPTION

The present invention may be described herein in terms of functional block components and various processing steps. It should be appreciated that such functional blocks may be realized by any number of hardware components or software elements configured to perform the specified functions. For example, the present invention may employ various integrated circuit components, e.g., memory elements, digital signal processing elements, logic elements, look-up tables, and the like, which may carry out a variety of functions under the control of one or more microprocessors or other control devices. In addition, those skilled in the art will appreciate that the present invention may be practiced in conjunction with any number of data and voice transmission protocols, and that the system described herein is merely one exemplary application for the invention.

It should be appreciated that the particular implementations shown and described herein are illustrative of the invention and its best mode and are not intended to otherwise limit the scope of the present invention in any way. Indeed, for the sake of brevity, conventional techniques for signal processing, data transmission, signaling, packet-based transmission, network control, and other functional aspects of the systems (and components of the individual operating components of the systems) may not be described in detail herein, but are readily known by skilled practitioners in the relevant arts. Furthermore, the connecting lines shown in the various figures contained herein are intended to represent exemplary functional relationships and/or physical couplings between the various elements. It should be noted that many alternative or additional functional relationships or physical connections may be present in a practical communication system.

Figure 1A:
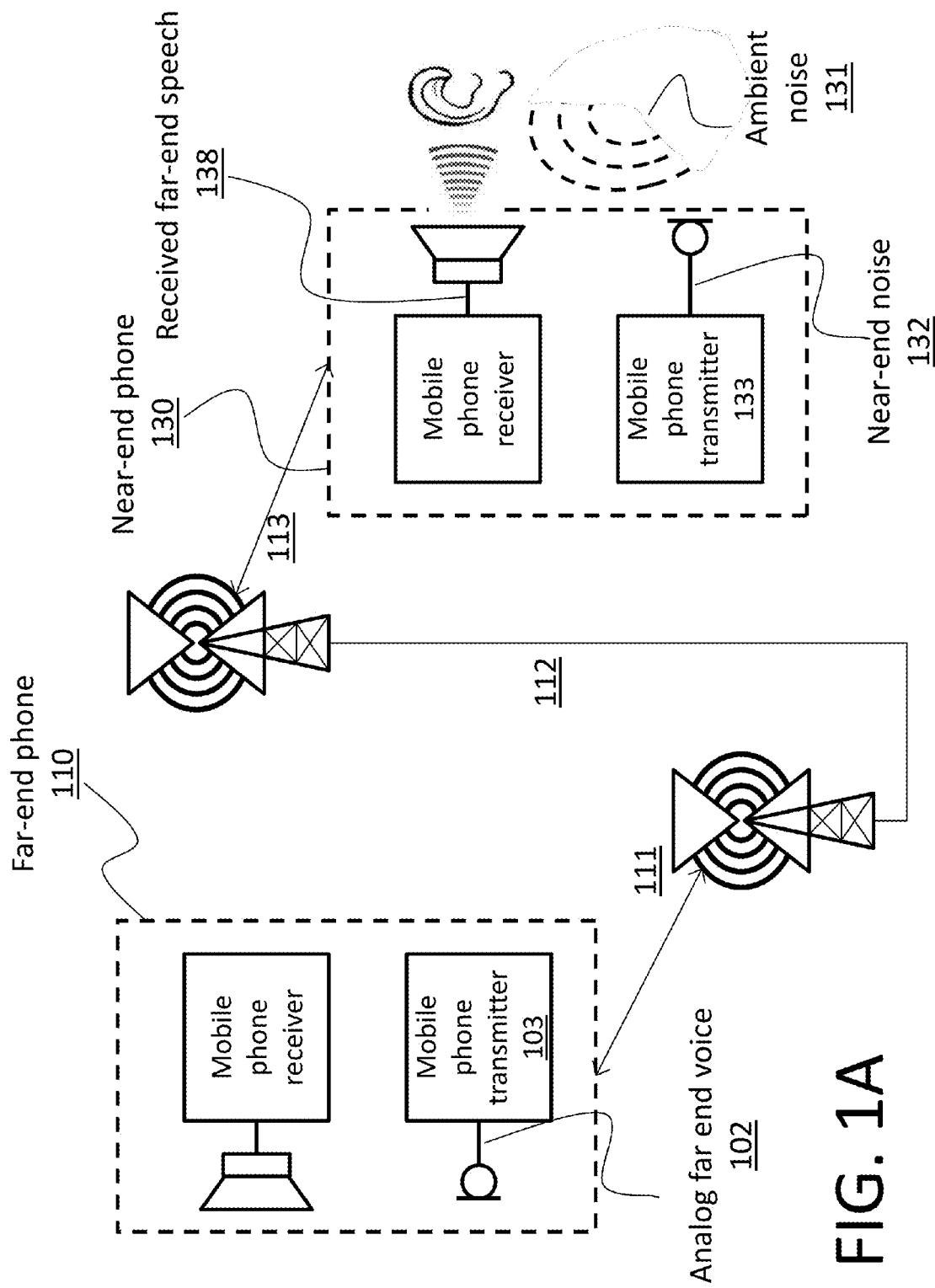
FIG. 1A is an exemplary block diagram representation of a mobile phone communication system in which various aspects of the present invention may be implemented.

FIG. 1A illustrates a typical mobile phone/personal communication system where two mobile phones, 110 and 130, are coupled together via a certain wireless and wireline connectivity between them 111, 112 and 113. When the far end talker speaks to the microphone, the speech signal is picked up by the far-end microphone that produces an analog far-end speech signal 102. The said speech signal 102 is then received by the far-end mobile phone transmitter 103 which transmits the speech signal to the near-end mobile phone 130 via the wireless/wireline connectivity, according to whatever wireless standard that both mobile phones and the wireless access/transport system need to support. Once received by the near-end mobile phone 130, the speech signal is converted back to its analog form called received far-end speech (or simply far-end speech) 138 before being played back through a loudspeaker or earphone. The user using the near-end phone might or might not be subject to a noticeable ambient noise 131 such as the case in a noisy bar or in a moving vehicle. It should be noted that the near end ambient noise 131 is picked up by the microphone on the near end mobile phone as part of the input 132 to the mobile phone transmitter 133 of the near-end mobile phone.

Figure 1B:
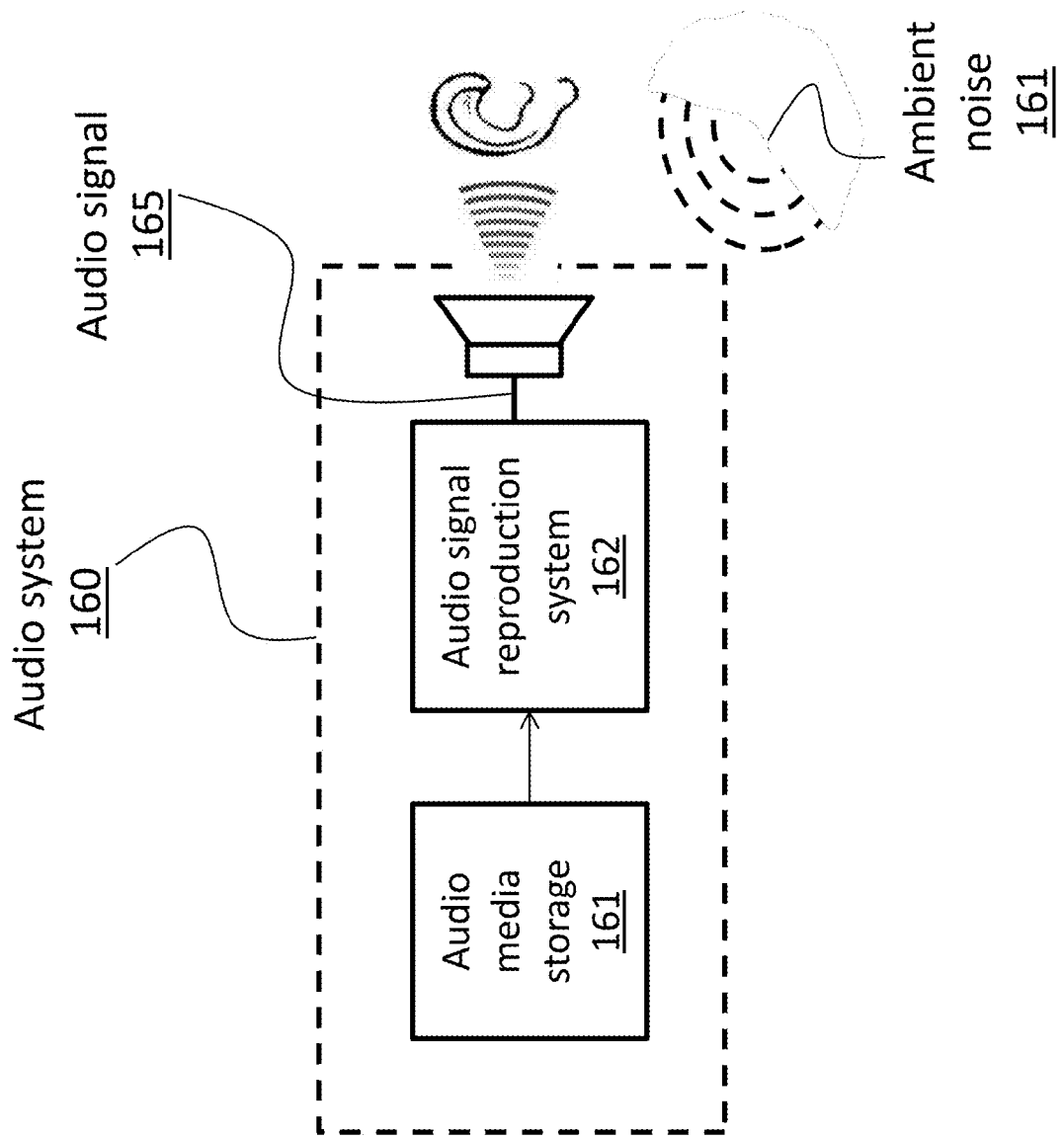
FIG. 1B is an exemplary block diagram representation of an audio playback system in which various aspects of the present invention may be implemented.

FIG. 1B illustrates a typical audio playback system 160 such as an MP3 player. Audio media files are stored in some type of storage device 161 such as a hard drive, a media card, or the like. When the user decides to play an audio file, the audio signal reproduction system 162 is fed with the media file from the storage 161, then reproduces an audio signal 165 that is played back through a loudspeaker or earphone. The listener using the audio playback system might or might not be subject to noticeable ambient noise 161 such as the case in a noisy bar or in a moving vehicle.

FIG. 2A depicts the far-end speech received by the near-end phone before and after the digital to analog (D/A) converter 210 in a typical mobile phone system. It is noted that since almost all modern mobile telephony systems are based on digital transmissions, the received far-end speech signal was in its digital form 230 before converted back to its analog form 235 by the D/A converter 210. The analog far-end speech is then fed to an adjustable volume amplifier 237 before passed on to the loudspeaker or earphone. FIG. 2B depicts the similar signal processing path used in an audio playback system.

In the examples used herein, the sampling rates of the digital far-end speech, the digital received far-end speech and the near end-noise are assumed to be the same, which is usually the case in typical communication systems. Using the same sampling rates simplifies speech processing and prevents the need to realign speech samples over time. Thus, for simplicity, the descriptions of the example embodiments herein assume that sampling rates are equal. However, in practice, if the sampling rates differ from one another, well-known techniques, including re-up-sampling or re-down-sampling of audio samples can be performed where appropriate to ensure the audio samples are aligned in time. These techniques are well known to those skilled in the art and are within the scope of the present invention. Accordingly, the use of the examples of audio systems that use the same sampling rates should not be construed to limit the scope and breadth of the present invention.

Figure 3:
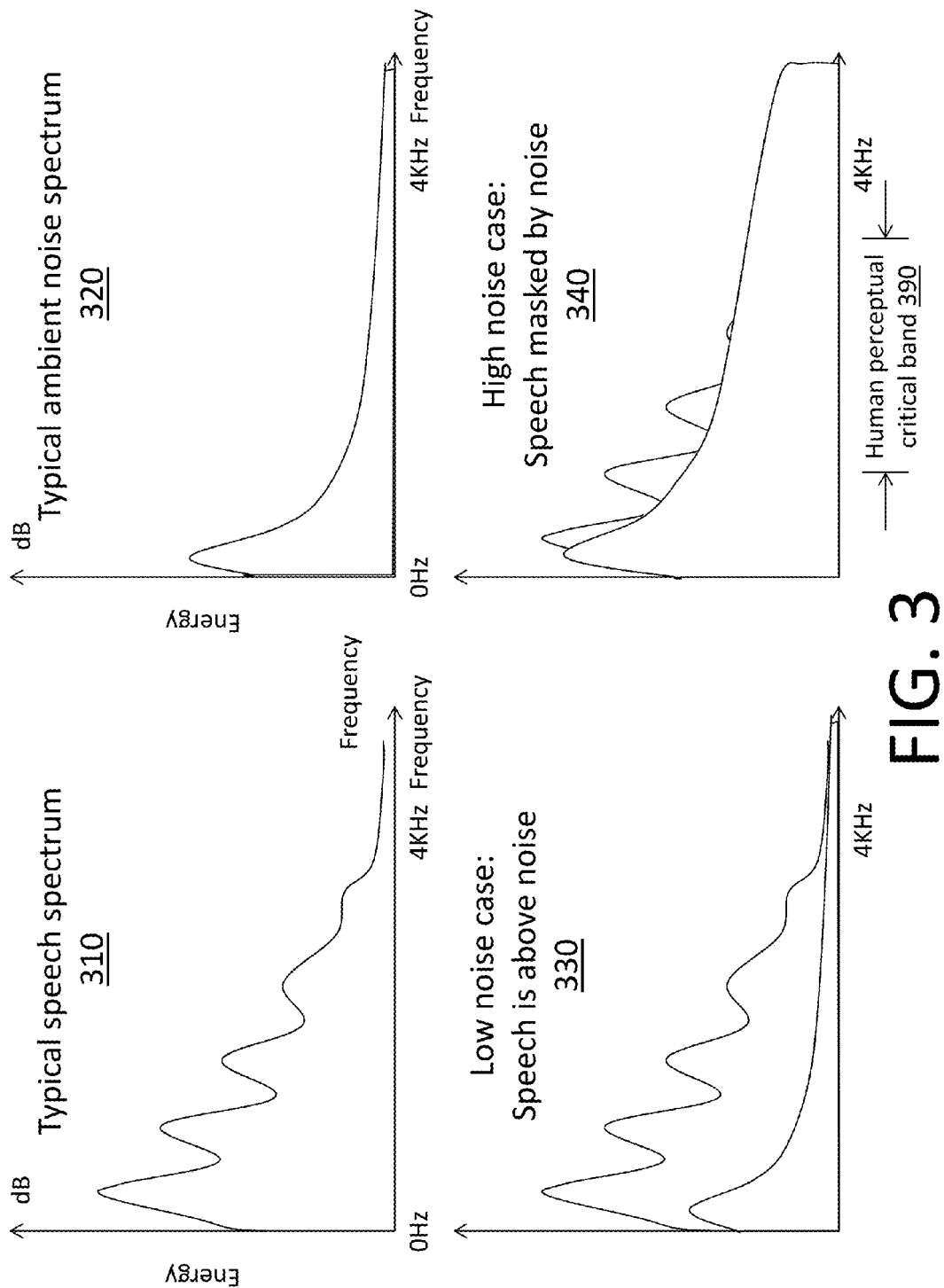
FIG. 3 illustrates the typical reason causing a user to experience a deteriorated voice quality due to increased ambient noise level.

Referring now to FIG. 3, it can be seen that the typical spectrum of speech signal 310 has very distinct characteristics: the energy in the high frequency region is significantly lower than that in the low frequency region. However, the typical ambient noise spectrum 320 remains almost flat above around 1.5 KHz.

With this distinct difference in spectrum, when the ambient noise level is low, the speech signal energy is almost always above the noise level across the entire spectrum 330, therefore impairment caused by the ambient noise is minor, and no special signal modification is necessary. However, when the noise level increases, the cross-over (i.e. the noise energy is higher than that of the speech signal) occurs much more frequently at high frequency regions, as shown in 340, making the high frequency portion of the speech partially or completely inaudible to the human auditory system.

Under severe conditions of high level ambient noise, it is necessary to keep the speech signal spectrum above the noise level so conversation or enjoyment remains possible, especially in the critical band for human intelligibility or human perception 390. One common way of modifying the signal is to simply increase the volume (or gain of the amplifier). Unfortunately, all mobile phone or infotainment handheld devices have a certain limit on the ability to increase volume, and in addition, an excessively high energy low frequency sound resulting from such a simple amplification is very disturbing to the human auditory system and/or even harmful due to potential of permanent damage that might arise. It is therefore advantageous to use a different approach: to adaptively shape the signal by means of an adaptive signal shaping system to enhance the energy in the perceptually critical spectral region 390 of the speech or audio signal under increased ambient noise conditions.

Figure 4A:
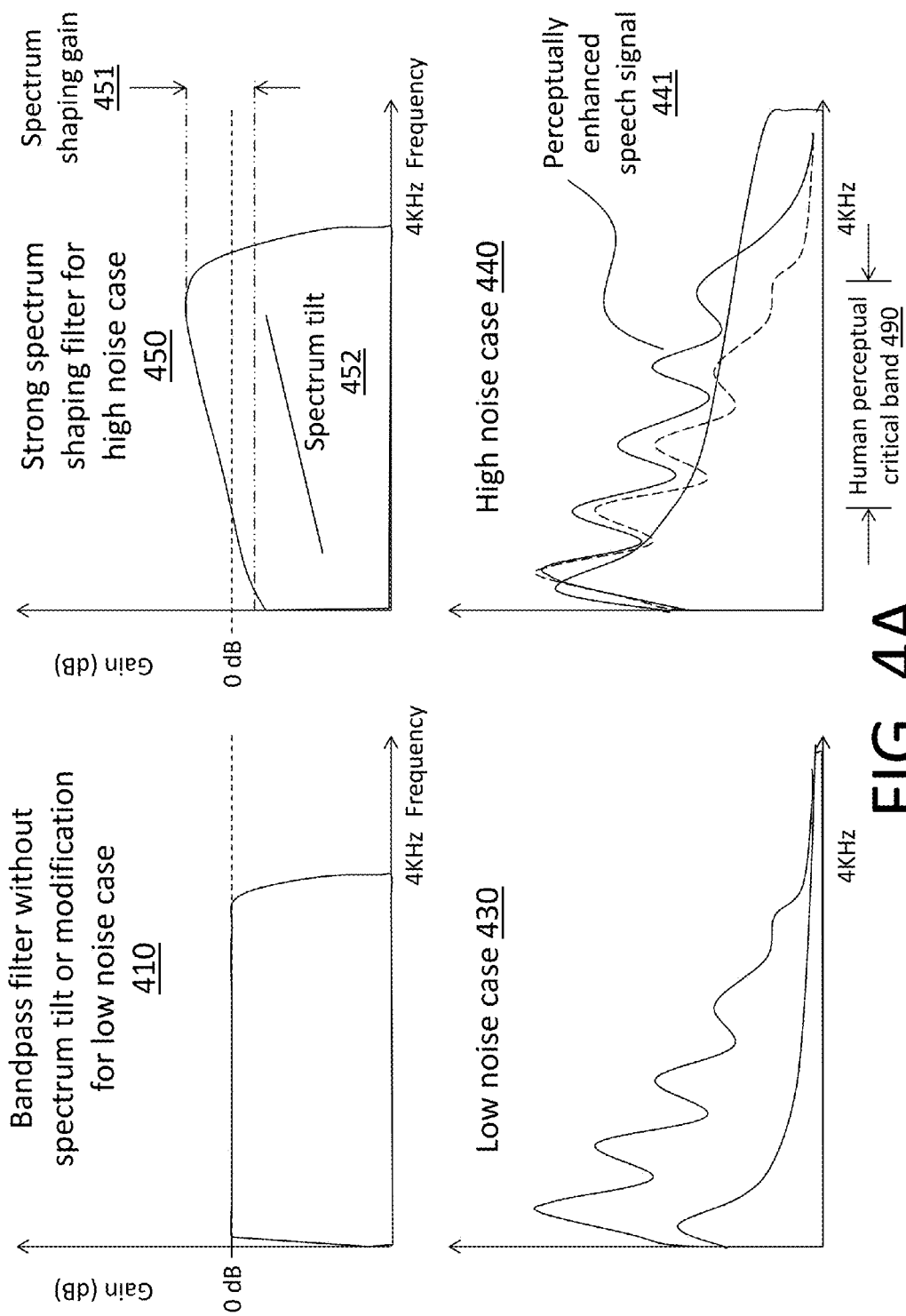
FIG. 4A demonstrates the desired signal shaping for a low noise case and a high noise case.

FIG. 4A illustrates the two extreme cases of the signal shaping employed by an exemplary embodiment of the present invention. It this example, a mobile phone is used and the speech signal is sampled at an 8 KHz sampling rate. This results in a frequency pass-band of 4 KHz. For the low noise case 430, a filtering with almost no spectrum shape change and/or volume change 410 is used. This results in no change to the speech signal as it is not necessary because at all times, the speech signal is above the ambient noise level.

For the high noise case 440, on the other hand, a strong spectrum shaping filter 450, together with an associated gain factor is used to optimize the speech signal. The desired outcome for the high noise case 440 is the generation of a strong perceptually enhanced speech signal 441.

It should be noted that in one embodiment of the present invention, with a strong signal shaping as described above in 440, the resulting signal will have a significantly increased energy in the high frequency region (between 1.5 KHz and 3 KHz) compared to the low frequency region (between 200 Hz and 1 KHz), sometimes called a spectrum tilt 452 comparing to the original signal, or the spectrum shaping gain 451. For example, when the far-end speech has a spectrum with a peak of −18 dB at the low frequency region vs. a peak of −45 dB at high frequency region, i.e. a difference of 27 dB, after the strong signal shaping, the difference could be reduced to 12 dB or even less, resulting in a net audible gain of 15 dB or more in the perceptually critical band, therefore enhancing the perceived quality of the modified speech signal in the presence of a strong ambient noise.

Since the noticeable ambient noise typically has a large range in terms of characteristics, for example its energy can range from −50 dBm to −10 dBm, in one exemplary embodiment of the present invention, 12 predetermined signal shaping filters are used, with each of them designed to be suitable for certain range of the ambient noise. It is worth noting that when the ambient noise level is very low, e.g., around −60 dBm or below, its effect becomes almost inaudible. Therefore there is no reason to be concerned about such impairment to the user's perception in this range.

In other embodiments of the present invention, one can choose to limit the maximum spectrum tilt or spectrum shaping gain that the signal shaping should apply to the audio signal, for example, anything above 2-3 dB can already generate noticeable benefits depending on the application conditions.

Figure 4B:
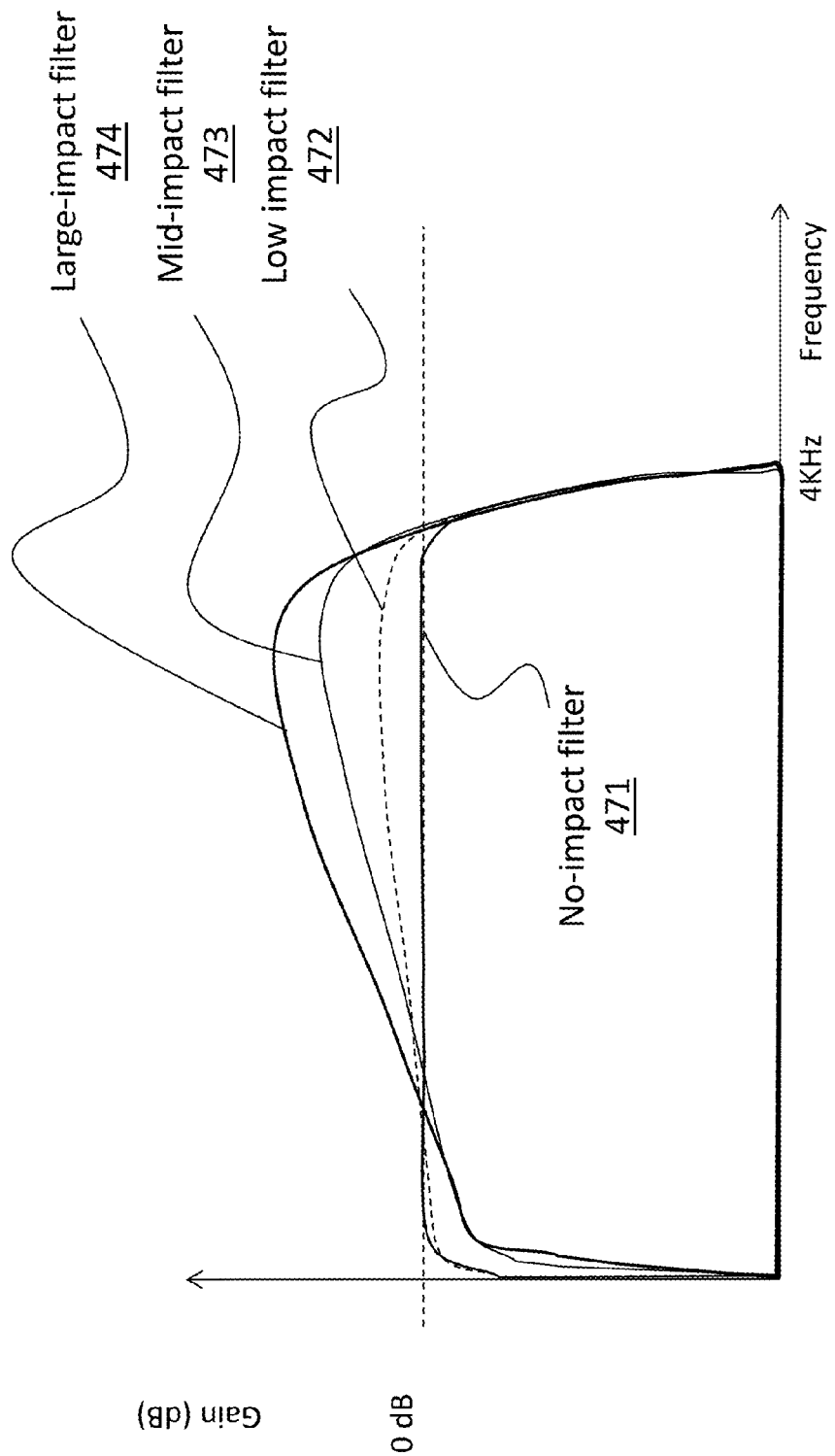
FIG. 4B shows an exemplary set of shaping filters in accordance with the present invention.

In another embodiment of the present invention, i.e. FIG. 4B, a set of predetermined signal shaping filters can increase the spectrum shaping gain gradually from 0 dB 471 to 25 dB or more 474, with some filters capable of only increasing the spectrum shaping gain to around 1-3 dB range, e.g., 472, while other filters capable of increasing the spectrum shaping gain to 20-25 dB range 474, and the rest of the filter(s) covering the middle range 473.

The filter coefficients can be either stored in a memory device such as a local memory unit(s) of the mobile phone or other storage means. Alternatively, in another example embodiment of the present invention, simple rules are generated and used so that the required coefficients are calculated in real time or "on the fly". For example, in one exemplary implementation of the present invention, linear IIR filters of the same order are used for signal shaping, and for a person skilled in the art, it is known that the linear combination of any two such a linear filters also result in a linear filter.

In yet another embodiment of the present invention for use in an audio playback system where the sampling rate of the audio signal is at 44.1 KHz or the like, the spectrum shaping filers and the input of ambient noise all need to be properly arranged to support such a sampling rate. A person skilled in the field can appreciate that this arrangement can be accomplished without departing from the principal approaches of the present invention.

Figure 5:
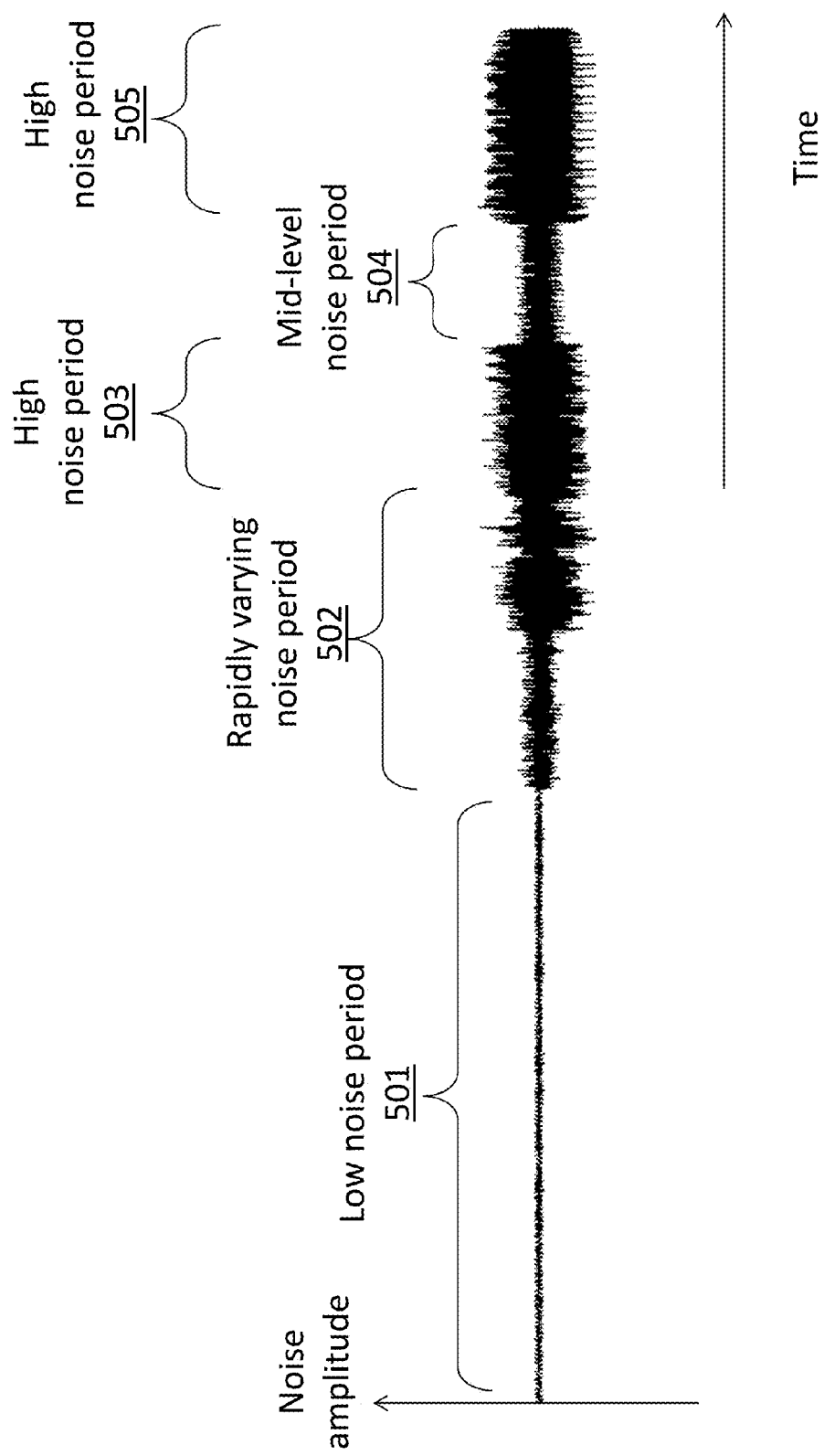
FIG. 5 shows typical time varying characteristics of an ambient noise.

Another aspect of the ambient noise is that it changes over time as shown in FIG. 5. It is very common to see that noise can have low level periods 501, rapidly changing periods 502, various mid-levels 504 or high levels 503, 505. The desired or the most appropriate signal shaping to be applied to the far-end speech should also vary in time, depending on the actual ambient noise level and/or characteristics. In another embodiment of the present invention, the use of an adaptive system becomes suitable to address this time variant aspect of the ambient noise.

Figure 6A:
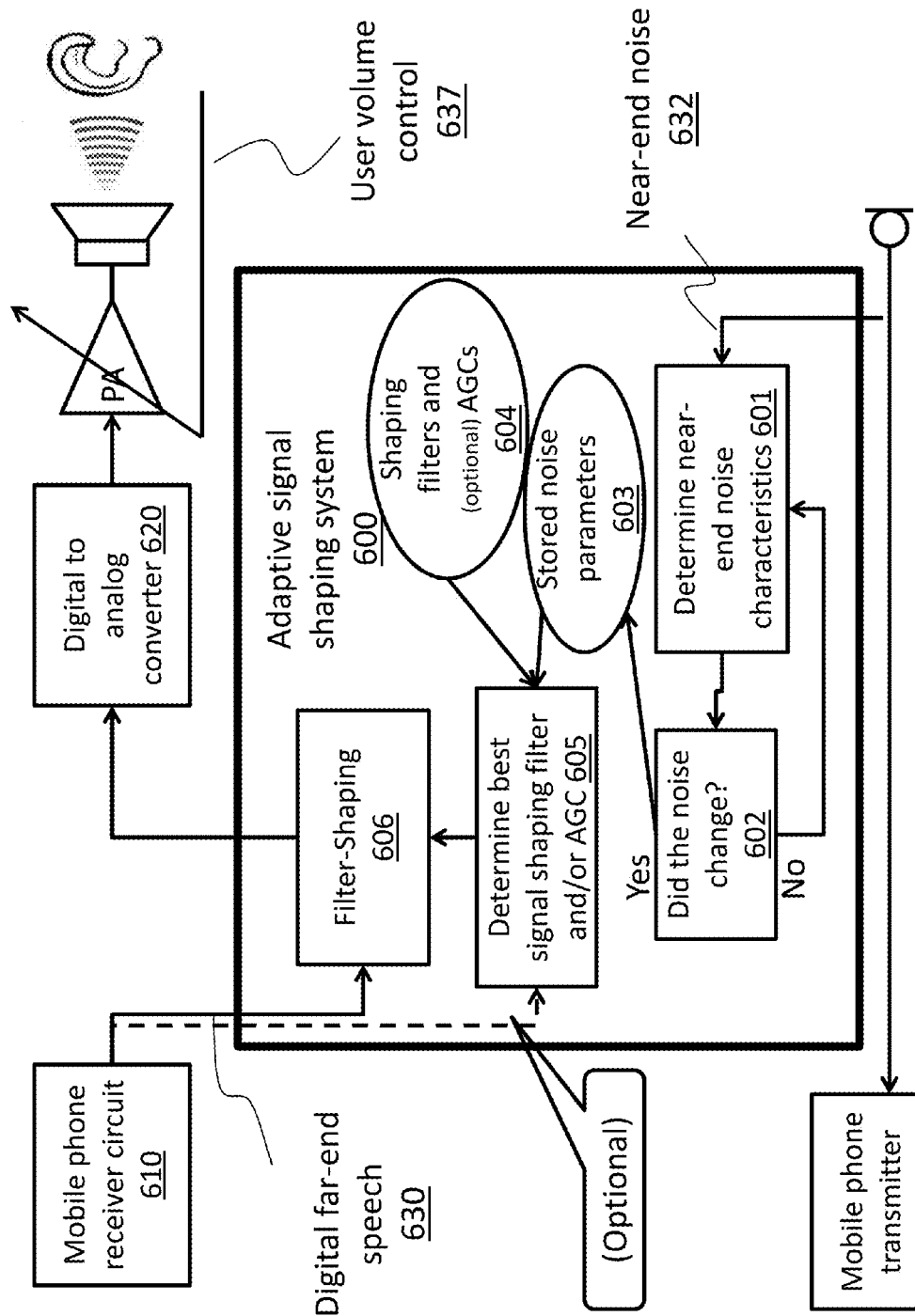
FIG. 6A presents an exemplary flowchart and block diagram describing a method and system for applying adaptive signal shaping on the received digital far-end speech for a wireless communication device in accordance with one implementation of the present invention.

FIG. 6A illustrates an example embodiment of the adaptive speech signal shaping system 600 used in a mobile phone in accordance with one embodiment of the present invention. The digital far-end speech signal 630 is reconstructed by the mobile phone receiver circuitry 610. The near-end noise signal 632 is always picked up by the microphone of the near-end mobile phone, some time together with the near-end voice produced by the near-end user. The near-end noise characteristics such as energy and spectrum, or parameters representing the spectrum information, are determined by the signal processing module 601. The near-end noise characteristics are then checked by module 602 to determine if the ambient noise has been changed from last determination. If there was no change, no update of the ambient noise parameters is required and the noise determination module goes back to monitor the ambient noise. However, if the ambient noise has changed, then the new noise parameters are stored 603, and the module 601 goes back to monitor ambient noise.

The noise parameters stored in 603 are used by the module 605 to determine the best choice of the signal shaping filter, with or without an associated volume modification factor (energy gain), among a set of at least one predetermined and/or pre-stored shaping filter(s) 604, with or without associated energy gains, to be used to enhance the far-end speech signal. In addition to, or even instead of, the best signal shaping filter, module 605 may select an automatic gain control (AGC) among a set of at least one predetermined and/or pre-stored AGC, with varying amounts of gain can be used to enhance the far-end speech signal 630 in module 606. Further details regarding the use of AGC in an exemplary embodiment of the present invention is described below with reference to FIG. 13.

In its decision, module 605 might or might not consider certain far-end speech signal characteristics, such as signal level, spectrum, signal type (i.e. voice signal only, or music signal only, or both), and far-end noise level that is embedded in the far-end speech. Once the choice of signal shaping filter and its energy gain are made, the next step is to apply the selected filter and energy gain to modify the far-end speech signal by the filtering module 606, before it is output to the digital to analog converter 620.

As mentioned previously, the trigger point of changing a signal shaping filter is when the ambient noise characteristics have changed, such as its level or type, so for a low complexity exemplary implementation of the present invention, one can combine modules 602, 603, and 605 together.

It is known by persons skilled in the art of signal processing, that many methods can be used to implement the signal shaping techniques disclosed herein and the present invention is not limited to any particular implementation described in the examples, including but not limited to the following:

The signal shaping mentioned in previous paragraphs can be implemented in either time domain by a filter or in frequency domain using a FFT based approach to result in a comparable or similar spectrum and/or volume modification of the signal.

Figure 6B:
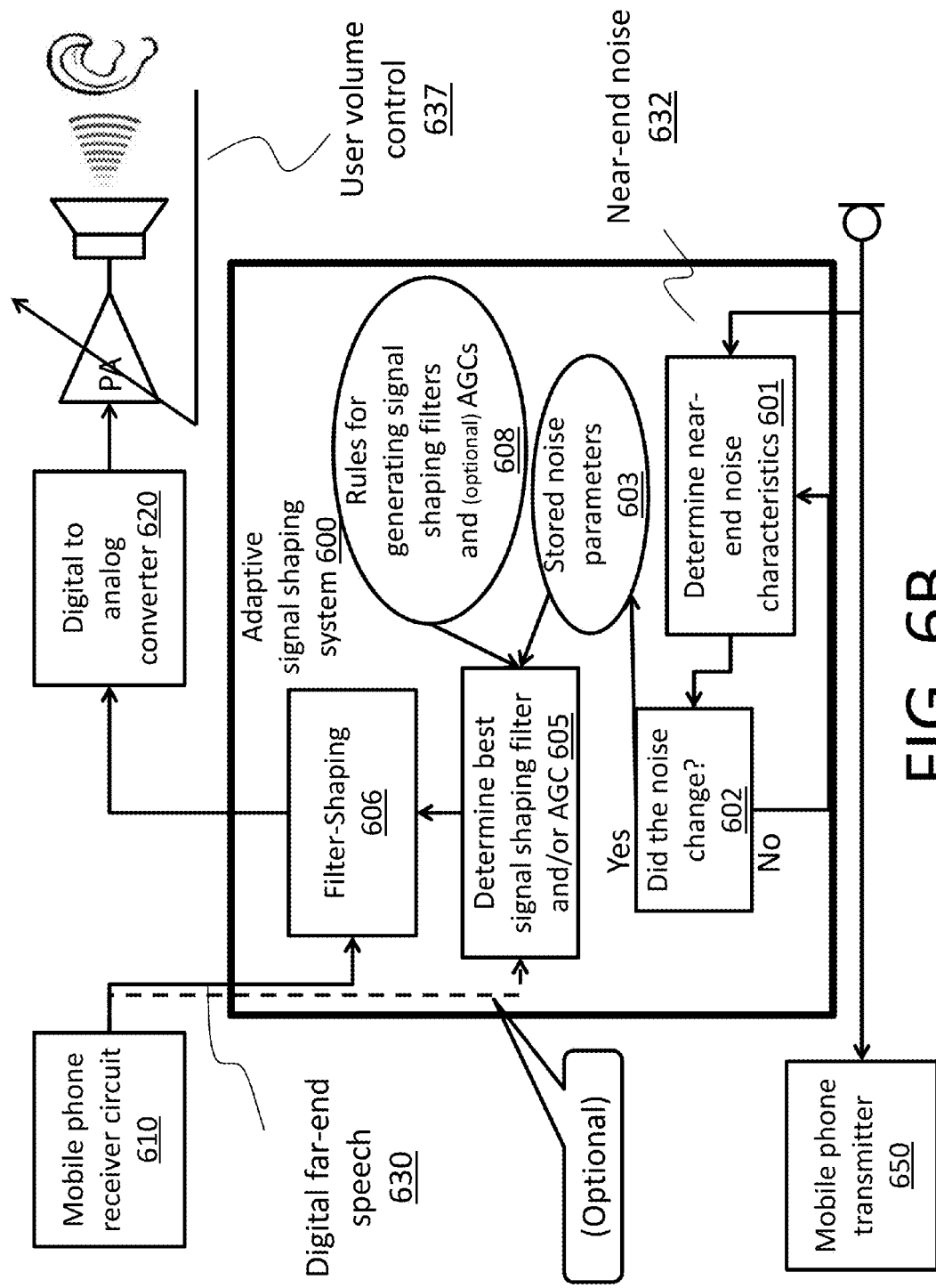
FIG. 6B presents an exemplary flowchart and block diagram describing a method and system for applying adaptive signal shaping on the received digital far-end speech for a wireless communication device in accordance with another implementation of the present invention.

FIG. 6B illustrates a slight variation of the example embodiment shown in FIG. 6A, namely the figures are identical, except for the substitution of a "Rules Generating Module" 608, instead of the filter and optional AGC storage module 604. When the signal shaping is implemented in either frequency or time domain, a preferred spectrum modification or shaping filter can be locally generated according to certain rules 608, instead of having to choose one from a predetermined and/or pre-stored finite set of shaping filter or spectrum modification candidates that are stored in memory 604. Filtering without a gain factor is equivalent to filtering with a gain that is set to the unity value of 1.

Figure 7:
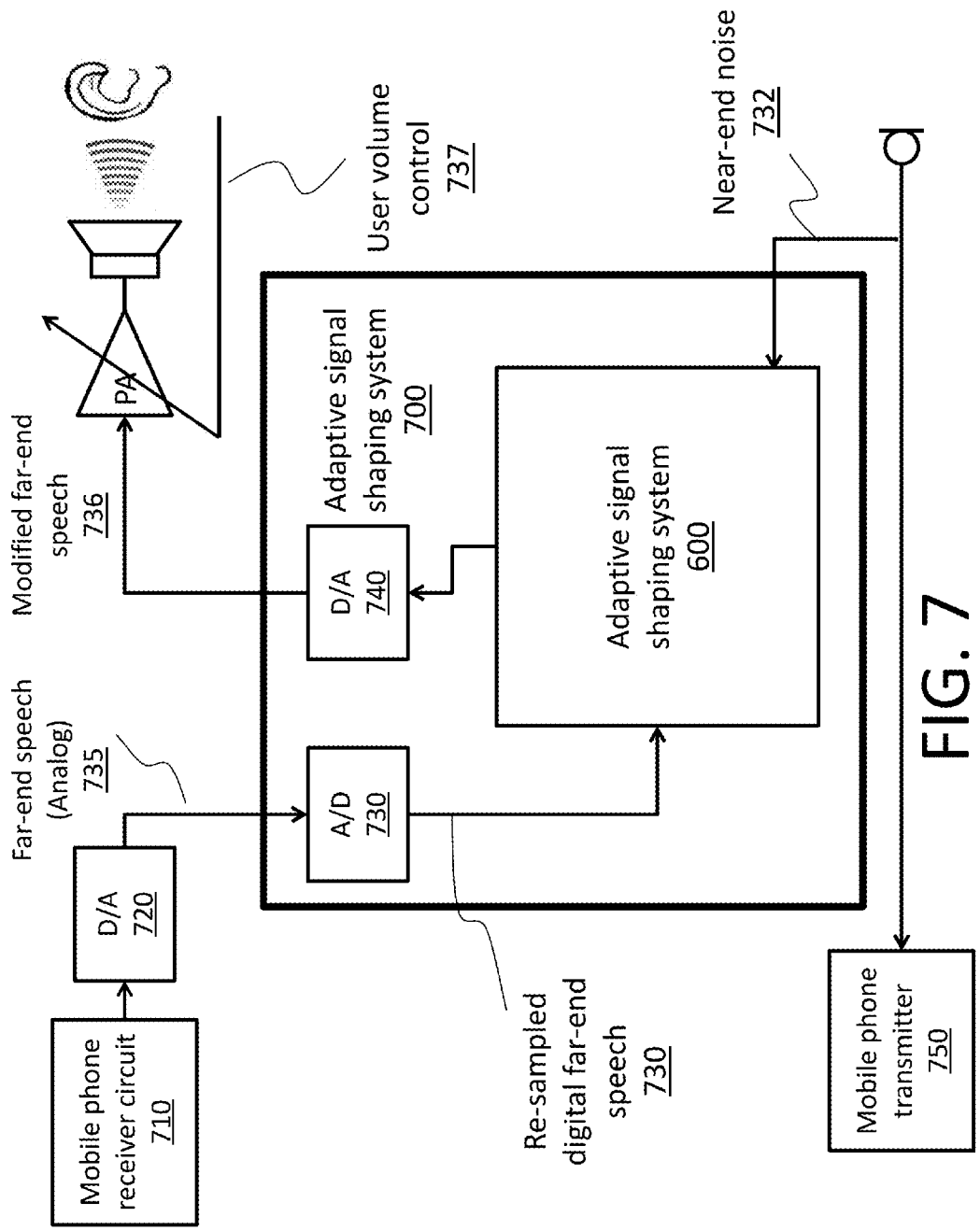
FIG. 7 presents another exemplary flowchart and block diagram describing a method of applying an adaptive signal shaping on the received analog far-end speech for a wireless communication device in accordance with another implementation of the present invention.

In another example embodiment of the present invention for a mobile phone application, FIG. 7, the analog far-end speech 735 from the mobile phone's D/A converter is fed to a re-sampling A/D converter 730 inside the adaptive signal shaping system 700 that produces a re-sampled digital far-end speech signal 730. The rest of the processing inside 400 is identical to that of the adaptive signal shaping system 600 described above, the only exception is that the output from the shaping filtering module is fed to a D/A converter 740 that finally outputs the modified analog far-end speech signal 736 to the volume amplifier.

Figure 8A:
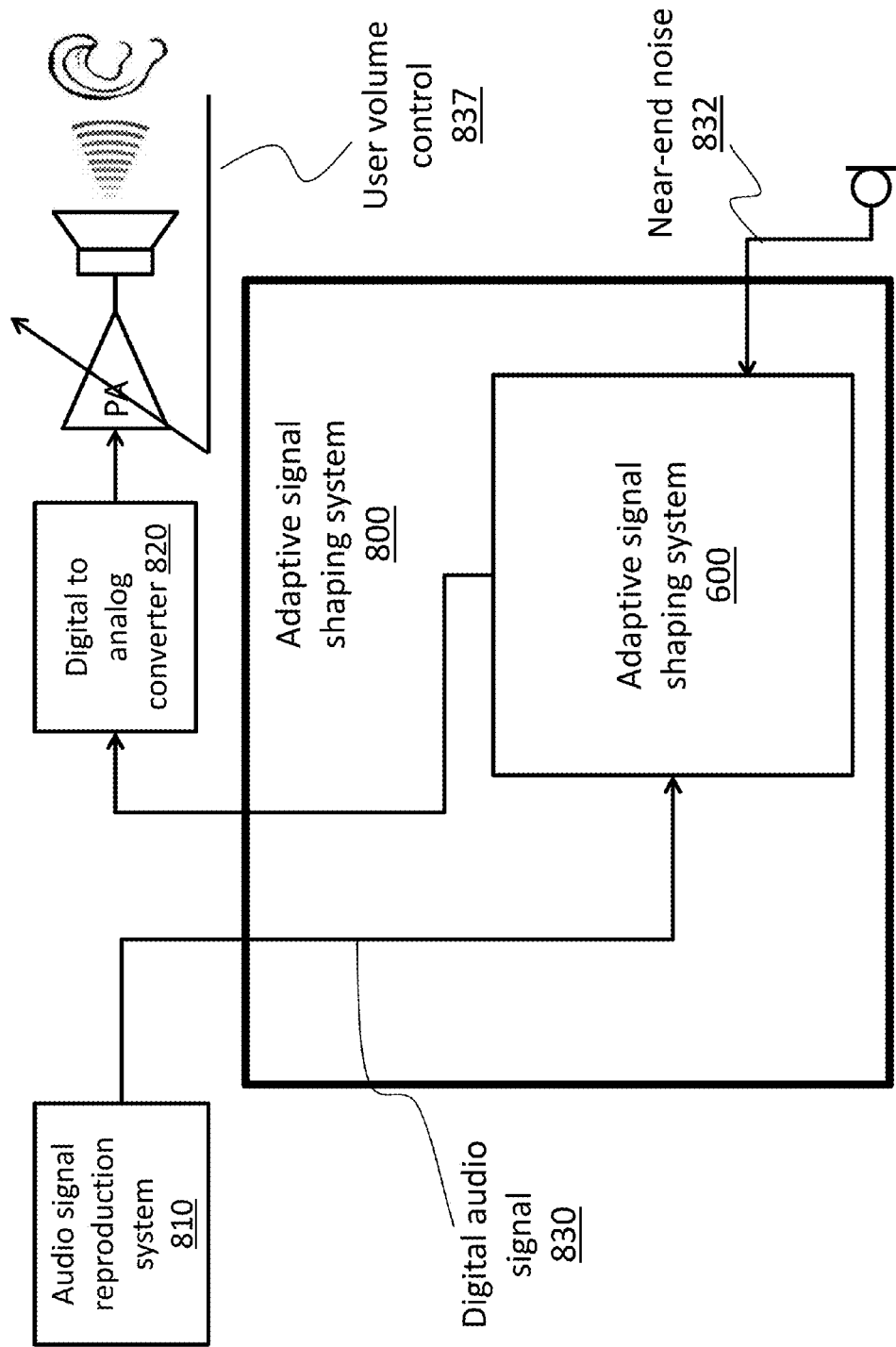
FIGS. 8A and 8B present exemplary flowcharts and block diagram describing methods for applying adaptive signal shaping on reproduced digital audio signals for an audio playback devices in accordance with various implementations of the present invention.
Figure 8B:
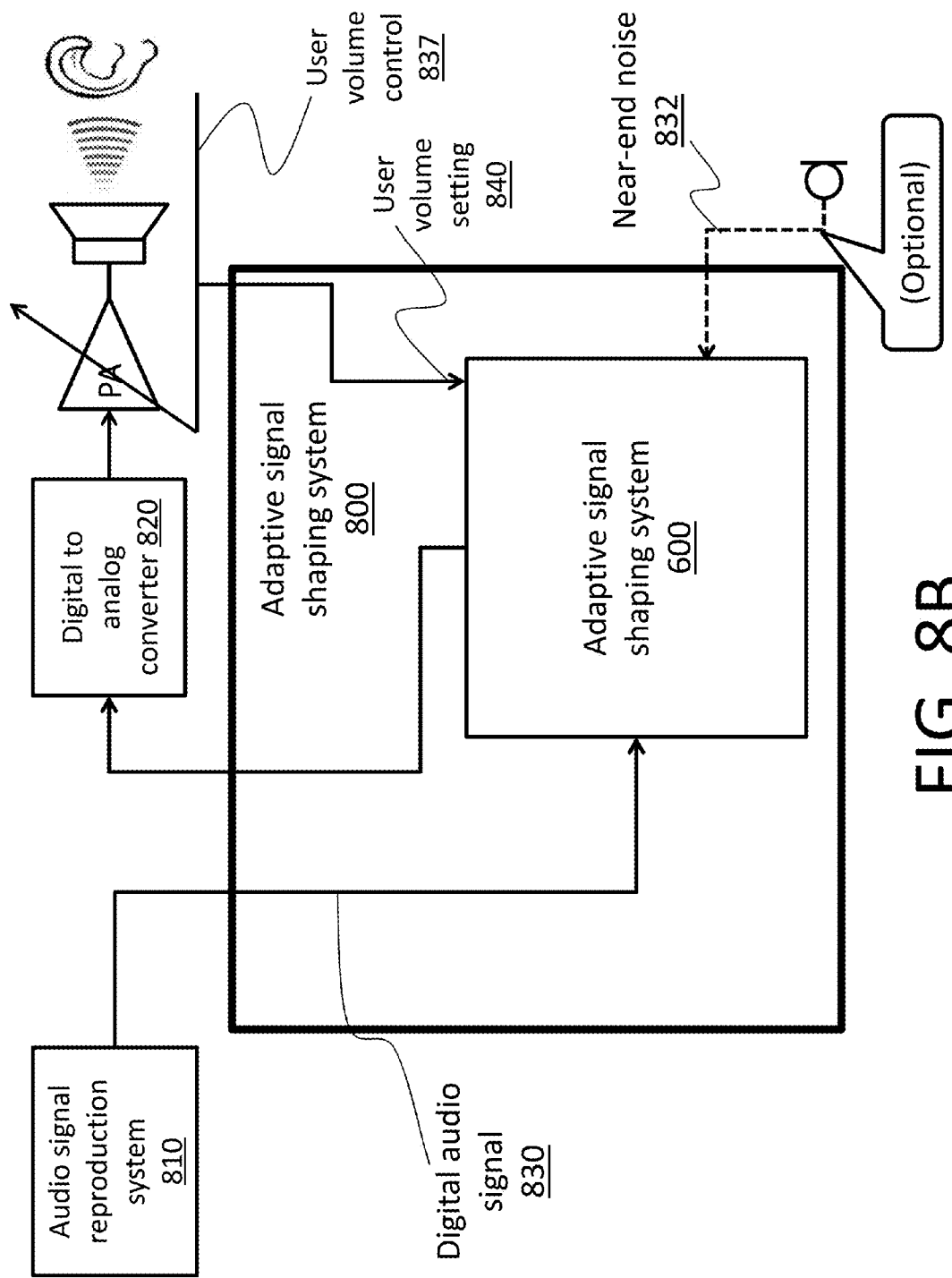
Figure 9:
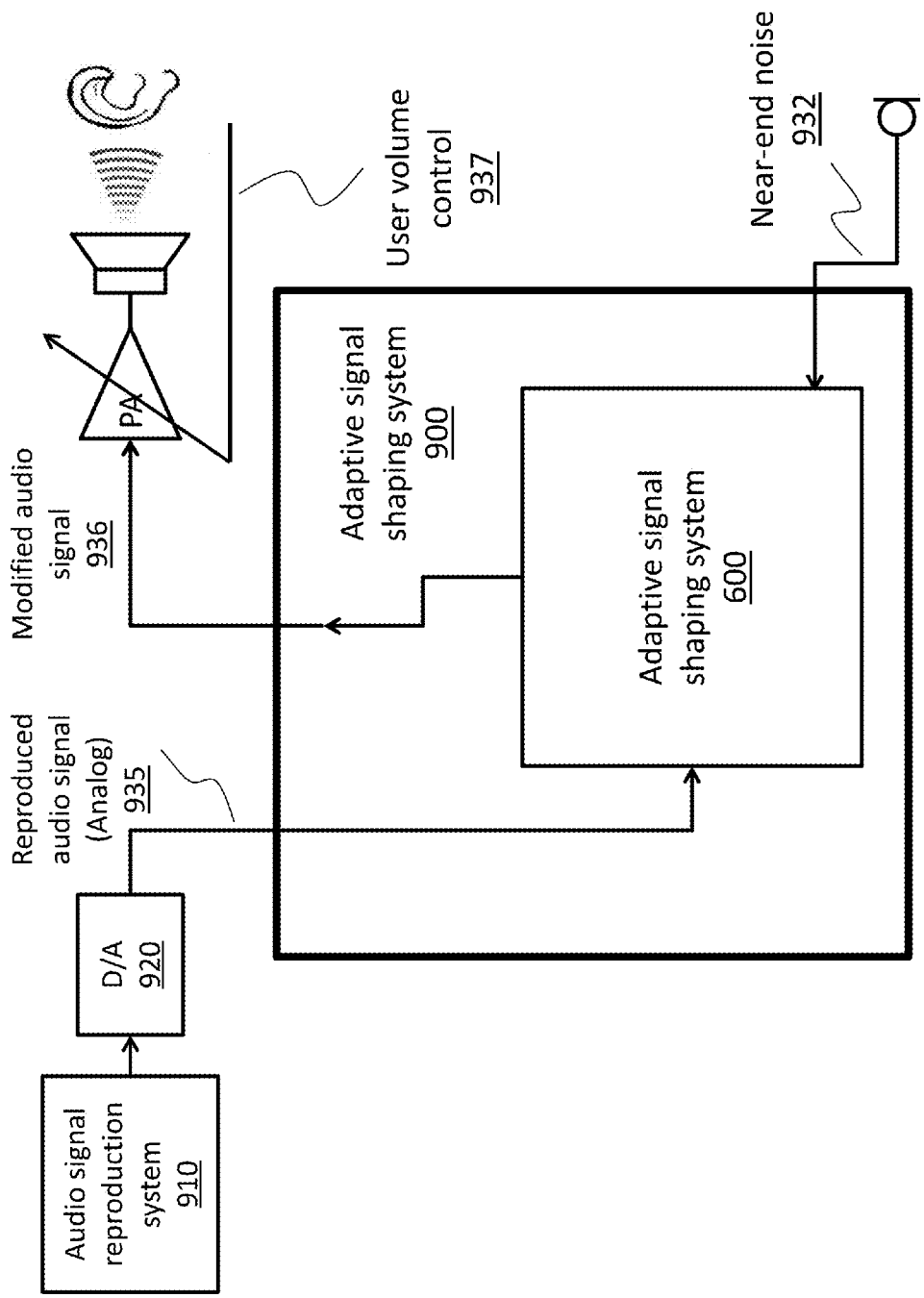
FIG. 9 presents another exemplary flowchart and block diagram describing a method of applying an adaptive signal shaping on the reproduced analog audio signal for an audio playback device in accordance with another implementation of the present invention.

FIGS. 8A, 8B and 9 illustrate three exemplary embodiments of present invention for various infotainment devices. The principles described in the previous examples are used in the exactly the same manner in these examples, except that infotainment devices, such as portable game devices, tablets and the like are used instead of mobile phones. For example, the principles of the present invention can be used to adaptively shape the audio output of a video game that is being played in a noisy environment. Likewise, the principals of the present invention can be used to adaptively shape the audio output of a movie or a music program played in a noisy environment. In fact, any audio signal can be adaptively shaped and treated as the "far-end speech" in the previous examples, when being played back in an environment that comprises local or ambient noise. The Adaptive signal shaping techniques described herein are performed in the Adaptive signal shaping systems 600 as shown in FIGS. 8A, 8B and 9. Many other example embodiments can be imagined using the principles of the present invention and would be apparent to those skilled in the relevant arts.

Another example of a preferred embodiment of the present invention is described with reference to FIG. 8B. In this example embodiment, rather than using the ambient noise level 832 to determine the amount of signal shaping to be performed, the user volume control 837 is used to achieve a desired perceived playback volume for the user. For example, it may be the case that some infotainment devices or other audio playback devices do not include a microphone or other input means to monitor the ambient noise level. In other cases, it may be desired to allow the user to control amount of signal shaping to be performed, even if an audio input means is included. In any case, as shown in FIG. 8B, the user volume setting level is input into the adaptive signal shaping system 600 and is used to determine the amount of signal shaping to be done, in accordance with the principles of the present invention. It should be noted that this concept can be used in any system, including systems, such as mobile phones that include a microphone to monitor the near-end noise 832. The volume level setting 840 can be used as a standalone indicator or in combination with the ambient noise 832, as described herein in any particular embodiment of the present invention, including any of the example embodiments shown in FIGS. 6 through 9.

In yet another example embodiment of the present invention, the input used to indicate the near-end noise 832 may be something other than a microphone. For example, as described above, ambient noise experienced in an automobile, or other mobile environment, such as a bus, boat or plane, generally increases in proportion to the speed. In one example embodiment, instead of using a microphone to monitor the ambient noise 832, another input means is used to monitor the speed of the user, which the adaptive signal shaping system 600 then uses to determine the level of signal shaping in accordance with the principles of the present invention. Such input devices may include for example, accelerometers or GPS devices or the like, many of which are already present in many mobile phones and other infotainment devices. Thus, the use of other inputs to indicate the near-end noise 832, either directly or indirectly, can be used in alternate embodiments of the present invention without departing from the principles described herein. Accordingly, the use of other input means to directly or indirectly indicate the level of ambient noise experience by a user should not be construed to limit the scope and breadth of the present invention.

Figure 10:
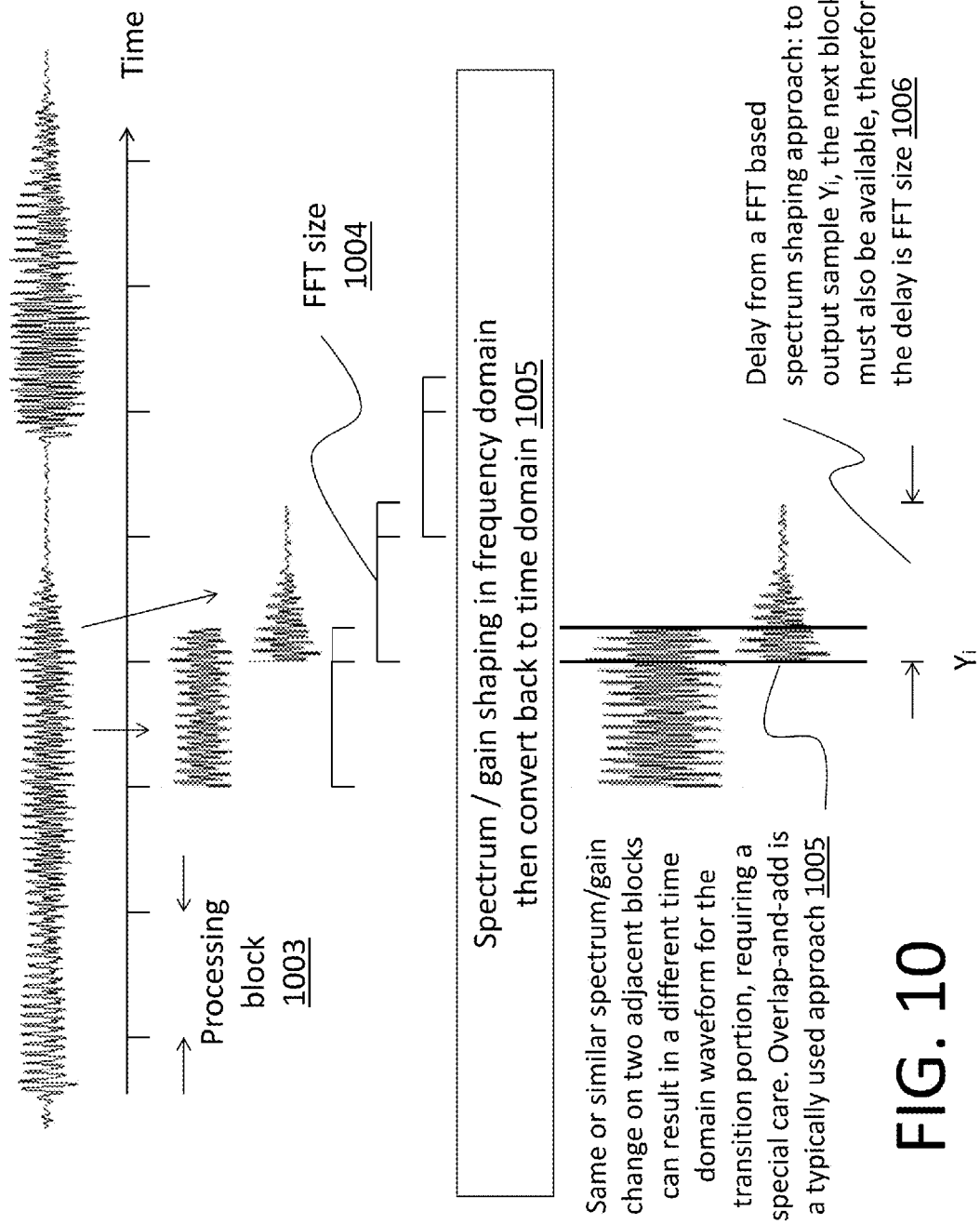
FIG. 10 illustrates a typical delay increase with a FFT based spectrum shaping technique.

In FIG. 10 a FFT based spectrum shaping flowchart is illustrated. As is well known in the relevant art, because FFT is a block based processing technique, input speech samples are grouped into processing blocks 1003. Due to its particularity, the commonly used overlap-and-add technique is typically used for a FFT based spectrum shaping: consisting of taking a FFT size 1004 that is larger than the processing block size 1003 in order to achieve extra samples between two adjacent processing blocks so the output samples from two separately processed FFT blocks can be smoothly transitioned, preventing therefore, a potentially sudden change in waveform that can create unwanted audible degradation in voice quality 1005. Due to this special arrangement, a FFT based spectrum shaping approach results in a delay increase that is equal to the FFT size used 1006. In a mobile phone communication system where the latency between two phones is already significant, extra large increase in delay is very objectionable.

Figure 11:
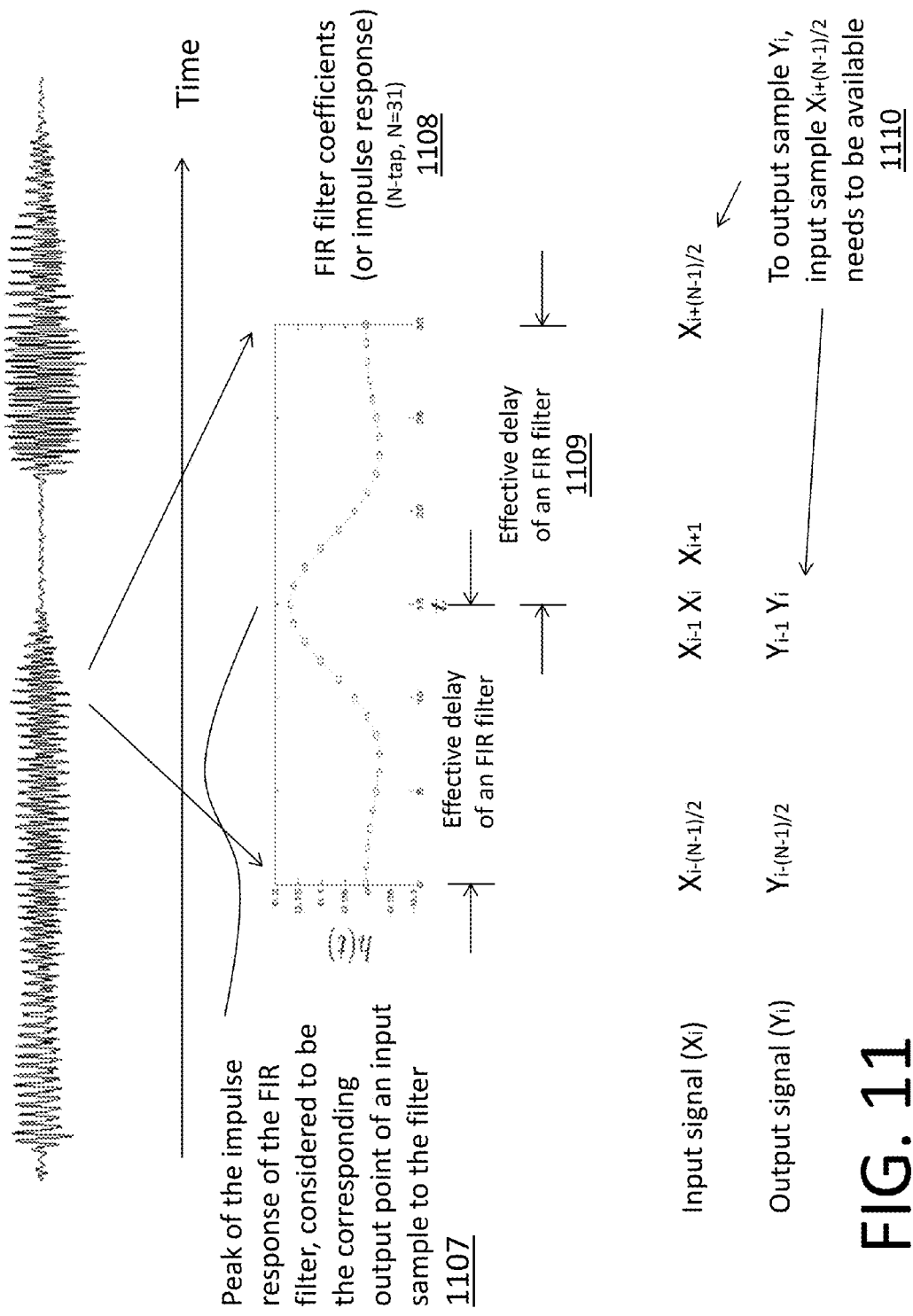
FIG. 11 illustrates a typical delay increase with a FIR filtering based spectrum shaping technique.

FIG. 11 demonstrates the typical delay increase with a FIR filtering to perform the spectrum shaping. The impulse response of a FIR filter (it is also the filter coefficients themselves) 1008 is typically long in order to guarantee certain required spectrum shaping capabilities. Since the peak of the impulse response is usually in the middle of the filter 1007, the corresponding output point of a FIR filter is considered to be in the middle of the filter length. In order to produce an output sample Yi, input samples up to Xi+(N−1)/2 must also be available 1110, where N is the length of the FIR filter (usually chosen to be an odd-number). In order words, a delay increase of (N−1)/2 samples 1109 is what a FIR filter will result. As stated before, this increase in delay is unwanted.

Figure 12:
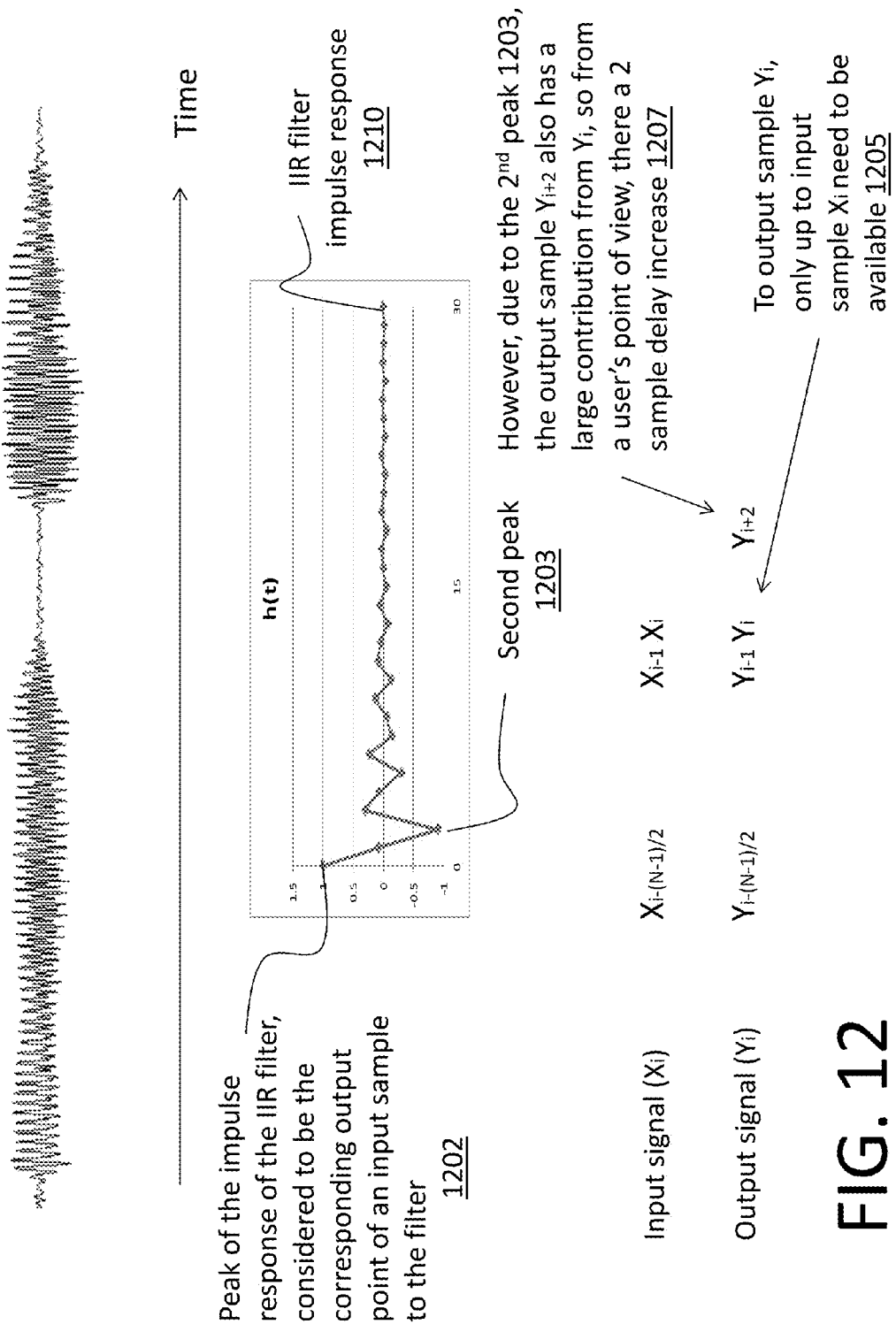
FIG. 12 illustrates a typical delay increase with an IIR filtering based spectrum shaping technique.

FIG. 12 illustrates the impulse response 1210 of an exemplary IIR filter in accordance to one embodiment of the present invention that is capable of delivering a certain spectrum modification. It can be seen that the peaks of the impulse response are at the very first few samples, therefore the extra delay caused by an IIR filter in a worst case is just a few samples. Therefore, using this approach yields a significant advantage over conventional methods and other approaches. It should be noted that for some unrelated IIR filter designs, the impulse response can have a very different characteristic than the one designed only for spectrum shaping in accordance to the present invention.

Due to the eventual telephone line loss or other variables, such as when the far-end talker is temporary further away from the far-end microphone, the received far-end signal might have signal level variations from time to time. While this variation might be useful in some cases as that might carry some nuance in the far-end speech signal when the ambient noise level is low and such low energy portion of the far-end speech is still audible and intelligible for the near-end user. But when the near-end noise level is high, certain low level signal will be simply inaudible. In those situations, it might be more desirable or even essential to perform an automatic gain control (AGC) in order to preserve intelligibility of the low level signal.

Figure 13:
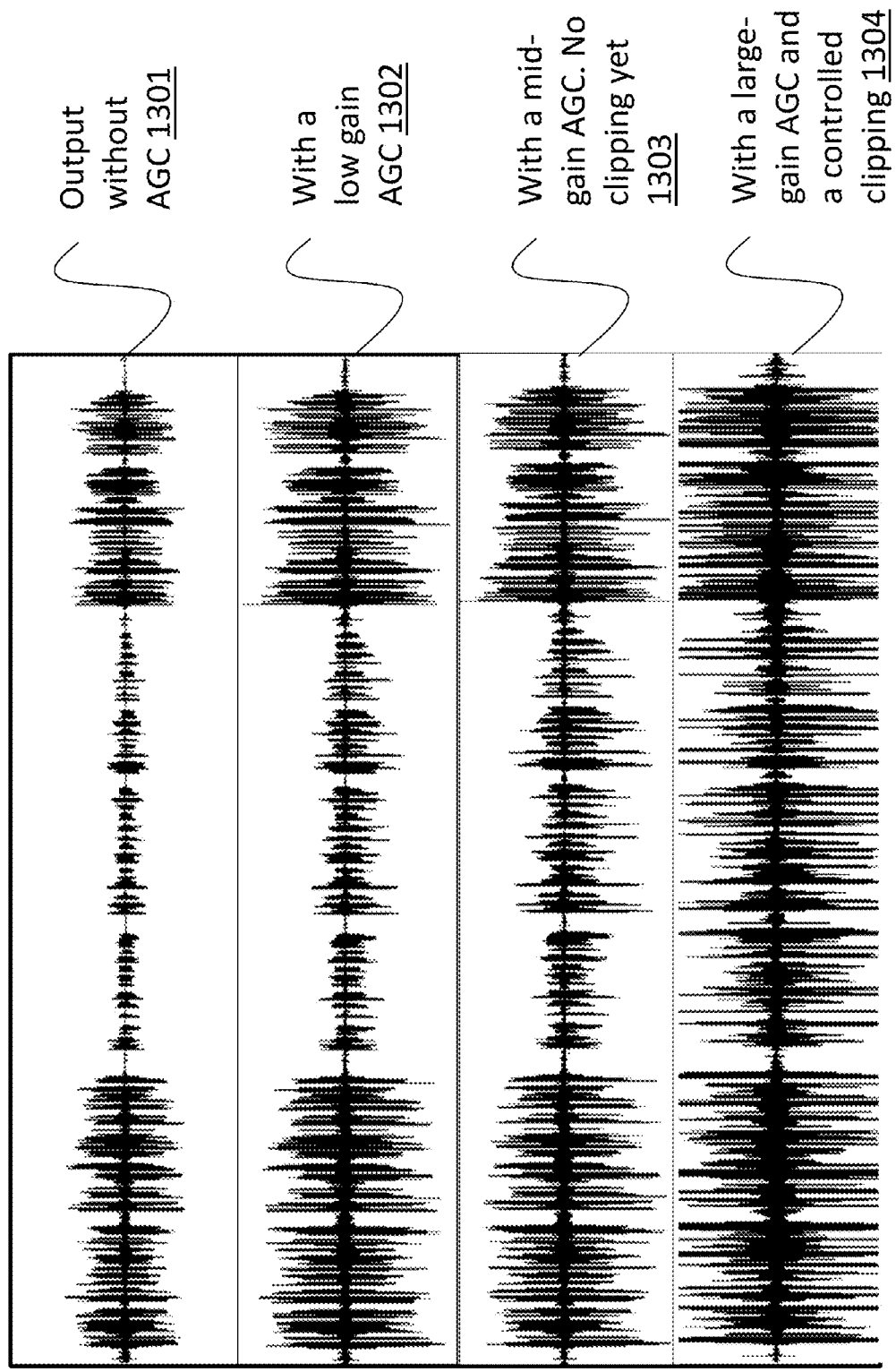
FIG. 13 illustrates an exemplary embodiment of the present invention with a multi-level gain AGC.

FIG. 13 illustrates an exemplary embodiment of the present invention with a multi-level gain AGC. In a preferred embodiment, AGC is used in conjunction with the signal shaping filter to perform the Shaping Filtering shown in module 606 in FIG. 6. For example, when the ambient noise level is determined to be low, the best signal shaping filter determination module 605 in FIG. 6 might decide not to apply any shaping 471 (FIG. 4) or only to apply a low impact shaping 472 to the reconstructed far-end signal. In such a case, it is also possible not to apply any AGC in order to preserve the nuance captured in the low level signal. When the noise level becomes high, AGC with different level of gain 1302 and 1303 can be applied to appropriately amplify low level signal to preserve intelligibility of the signal. In an extreme case of a high level ambient noise, where it is better to let certain signal samples to exceed the clipping level (maximum output sample level due to numerical representation of an audio sample), a large gain AGC 1304 can also be applied. However, because most commonly used D/A converters in a mobile phone or a handheld infotainment device can only take up to 16-bit digital PCM (pulse-code modulation) samples as input, the maximum numerical representation of an output sample should be less than $2^{15}-1=32767$, or larger than $-32767$. A careful handling of the clipping is important: to prevent unwanted artifacts due to potential signal sign change, in an exemplary implementation of the present invention, when a sample's value would exceed the upper or lower bound limit, the sample should take a value slightly less than the limits. The reason is that some D/A converters can generate unstable output if fed with maximum digital input values.

Figure 14:
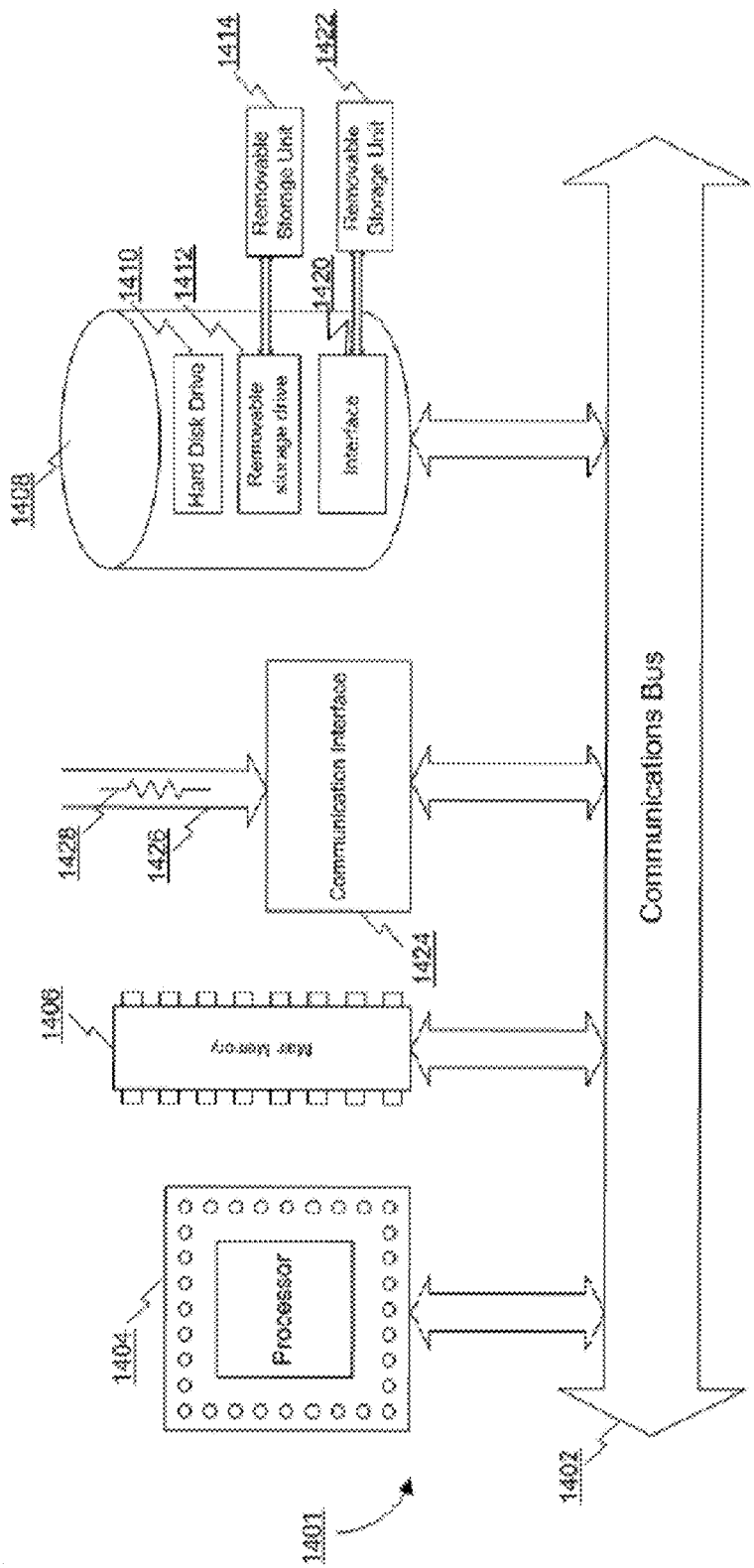
FIG. 14 illustrates a typical computer system capable of implementing an example embodiment of the present invention.

The present invention may be implemented using hardware, software or a combination thereof and may be implemented in a computer system or other processing system. Computers and other processing systems come in many forms, including wireless handsets, portable music players, infotainment devices, tablets, laptop computers, desktop computers and the like. In fact, in one embodiment, the invention is directed toward a computer system capable of carrying out the functionality described herein. An example computer system 1401 is shown in FIG. 14. The computer system 1401 includes one or more processors, such as processor 1404. The processor 1404 is connected to a communications bus 1402. Various software embodiments are described in terms of this example computer system. After reading this description, it will become apparent to a person skilled in the relevant art how to implement the invention using other computer systems and/or computer architectures.

Computer system 1401 also includes a main memory 1406, preferably random access memory (RAM), and can also include a secondary memory 1408. The secondary memory 1408 can include, for example, a hard disk drive 1410 and/or a removable storage drive 1412, representing a magnetic disc or tape drive, an optical disk drive, etc. The removable storage drive 1412 reads from and/or writes to a removable storage unit 1414 in a well-known manner. Removable storage unit 1414, represent magnetic or optical media, such as disks or tapes, etc., which is read by and written to by removable storage drive 1412. As will be appreciated, the removable storage unit 1414 includes a computer usable storage medium having stored therein computer software and/or data.

In alternative embodiments, secondary memory 1408 may include other similar means for allowing computer programs or other instructions to be loaded into computer system 1401. Such means can include, for example, a removable storage unit 1422 and an interface 1420. Examples of such can include a USB flash disc and interface, a program cartridge and cartridge interface (such as that found in video game devices), other types of removable memory chips and associated socket, such as SD memory and the like, and other removable storage units 1422 and interfaces 1420 which allow software and data to be transferred from the removable storage unit 1422 to computer system 1401.

Computer system 1401 can also include a communications interface 1424. Communications interface 1424 allows software and data to be transferred between computer system 1401 and external devices. Examples of communications interface 1424 can include a modem, a network interface (such as an Ethernet card), a communications port, a PCM-CIA slot and card, etc. Software and data transferred via communications interface 1424 are in the form of signals which can be electronic, electromagnetic, optical or other signals capable of being received by communications interface 1424. These signals 1426 are provided to communications interface via a channel 1428. This channel 1428 carries signals 1426 and can be implemented using wire or cable, fiber optics, a phone line, a cellular phone link, an RF link, such as WiFi or cellular, and other communications channels.

In this document, the terms "computer program medium" and "computer usable medium" are used to generally refer to media such as removable storage device 1412, a hard disk installed in hard disk drive 1410, and signals 1426. These computer program products are means for providing software or code to computer system 1401.

Computer programs (also called computer control logic or code) are stored in main memory and/or secondary memory 1408. Computer programs can also be received via communications interface 1424. Such computer programs, when executed, enable the computer system 1401 to perform the features of the present invention as discussed herein. In particular, the computer programs, when executed, enable the processor 1404 to perform the features of the present invention. Accordingly, such computer programs represent controllers of the computer system 1401.

In an embodiment where the invention is implemented using software, the software may be stored in a computer program product and loaded into computer system 1401 using removable storage drive 1412, hard drive 1410 or communications interface 1424. The control logic (software), when executed by the processor 1404, causes the processor 1404 to perform the functions of the invention as described herein.

In another embodiment, the invention is implemented primarily in hardware using, for example, hardware components such as application specific integrated circuits (ASICs). Implementation of the hardware state machine so as to perform the functions described herein will be apparent to persons skilled in the relevant art(s).

In yet another embodiment, the invention is implemented using a combination of both hardware and software.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A mobile phone system for improving the perceived quality of a far-end speech signal for playback in a noisy environment, said system comprising:
    a microphone capable of continuously monitoring near-end noise signals;
    a characteristics module for continuously determining near-end noise characteristics from said near-end noise signals;
    a first memory device used for storing data representing said near-end noise characteristics;
    a comparison module for comparing said near-end noise characteristics from previous near-end noise characteristics to detect a change in said near-end noise audio signal;
    a selection module for, upon detecting a change, identifying an optimal signal shaping filter used to optimize said far-end speech signal based only on said near-end noise characteristics;
    a filter-shaping module for continuously applying said optimal signal shaping filter to the far-end speech signal, when said near-end noise signals are above a predetermined threshold, to produce an optimized far-end speech signal; and
    a digital to analog converter for outputting said optimized far-end speech signal to a loudspeaker for optimized playback in a noisy environment.

2. The system of claim 1, further comprising a second memory device for storing a plurality of pre-determined signal shaping filters; and
    said selection module selects said optimal shaping filter from said second memory device based on said near-end noise characteristics.

3. The system of claim 2, wherein said plurality of predetermined signal shaping filters are designed so that they each cause a different spectrum shaping gain increase when applied to said far-end speech signal by said filter-shaping module.

4. The system of claim 1, wherein said optimal signal shaping filter is identified such that when applied to the far-end speech signal in said filter-shaping module, the spectrum energy of said optimized far-end speech signal is higher than the spectrum energy of said near-end noise signal at frequencies within predetermined bands of human perception.

5. The system of claim 1, wherein said optimal shaping filter is an infinite impulse response filter.

6. The system of claim 1, further comprising a rule generator module for generating said optimal signal shaping filter in real time based on said near-end noise characteristics.

7. The system of claim 6 wherein said rules are designed to generate said optimal signal shaping filter so that when applied to the far-end speech signal in said filter-shaping module, the spectrum energy of said optimized far-end speech signal is higher than the spectrum energy of the near-end noise signal at frequencies within predetermined bands of human perception.

8. The system of claim 1, wherein said near-end noise characteristics include parameters representing spectrum information of said near-end noise signal.

9. A mobile phone system for improving the perceived quality of a far-end speech signal for playback in a noisy environment, said system comprising:
- a microphone capable of continuously monitoring near-end noise signals;
- a mobile phone receiver circuit for receiving the far-end speech signal;
- a characteristics module for continuously determining near-end noise characteristics from said near-end noise signals and far-end speech characteristics from the far-end speech signal;
- a first memory device used for storing data representing said near-end noise characteristics and said far-end speech characteristics;
- a comparison module for comparing said near-end noise characteristics from previous near-end noise characteristics to detect a change in said near-end noise audio signal;
- a selection module for, upon detecting a change, identifying an optimal signal shaping filter used to optimize said far-end speech signal based only on said near-end noise characteristics and said far-end speech characteristics;
- a filter-shaping module for continuously applying said optimal signal shaping filter to the far-end speech signal, when said near-end noise signals are above a predetermined threshold, to produce an optimized far-end speech signal; and
- a digital to analog converter for outputting said optimized far-end audio signal to a loudspeaker for optimized playback in a noisy environment.

10. A mobile phone system for improving the perceived quality of a far-end speech signal for playback in a noisy environment, said system comprising:
- a microphone capable of continuously monitoring near-end noise signals;
- a characteristics module for continuously determining near-end noise characteristics from said near-end noise signals;
- a first memory device used for storing data representing said near-end noise characteristics;
- a comparison module for comparing said near-end noise characteristics from previous near-end noise characteristics to detect a change in said near-end noise audio signal;
- a selection module for, upon detecting a change, identifying an optimal signal shaping filter and an optimal automatic gain control used to optimize said far-end speech signal based on said near-end noise characteristics;
- a filter-shaping module for continuously applying said optimal signal shaping filter and said optimal automatic gain control to the far-end speech signal, when said near-end noise signals are above a predetermined threshold, to produce an optimized far-end speech signal; and
- a digital to analog converter for outputting said optimized far-end audio signal to a loudspeaker for optimized playback in a noisy environment.

11. The system of claim 10, further comprising a second memory device for storing a plurality of pre-determined automatic gain controls; and
said selection module selects said optimal shaping filter from said second memory device based on said near-end noise characteristics.

12. The system of claim 11, wherein said plurality of pre-determined automatic gain controls are designed so that they each cause a different gain increase when applied to said far-end speech signal by said filter-shaping module.

13. The system of claim 10, wherein said optimal automatic gain control is identified such that when applied to the far-end speech signal in said filter-shaping module, the spectrum energy of said optimized far-end speech signal is higher than the spectrum energy of said near-end noise signal at frequencies within predetermined bands of human perception.

14. The system of claim 10, further comprising a rule generator module for generating said optimal automatic gain control in real time based on said near-end noise characteristics.

15. A portable music system for improving the perceived quality of a generated music signal for playback in a noisy environment, said system comprising:
- a microphone capable of continuously monitoring near-end noise signals;
- a characteristics module for continuously determining near-end noise characteristics from said near-end noise signals;
- a first memory device used for storing data representing said near-end noise characteristics;
- a comparison module for comparing said near-end noise characteristics from previous near-end noise characteristics to detect a change in said near-end noise audio signal;
- a selection module for, upon detecting a change, identifying an optimal signal shaping filter used to optimize said generated music signal based on said near-end noise characteristics;
- a filter-shaping module for continuously applying said optimal signal shaping filter to the generated music signal, when said near-end noise signals are above a predetermined threshold, to produce an optimized music playback signal; and
- a digital to analog converter for outputting said optimized music playback signal to a loudspeaker for optimized playback in a noisy environment.

16. A system for improving the perceived quality of an audio signal for playback on a digital infotainment device in a noisy environment, said system comprising:
- a microphone capable of continuously monitoring near-end noise signals;
- a characteristics module for continuously determining near-end noise characteristics from said near-end noise signals;
- a first memory device used for storing data representing said near-end noise characteristics;
- a comparison module for comparing said near-end noise characteristics from previous near-end noise characteristics to detect a change in said near-end noise audio signal;
- a selection module for, upon detecting a change, identifying an optimal signal shaping filter used to optimize said audio playback based on said near-end noise characteristics;
- a filter-shaping module for continuously applying said optimal signal shaping filter to the said audio signal, when said near-end noise signals are above a predetermined threshold, to produce an optimized audio playback signal; and
- a digital to analog converter for outputting said optimized audio playback signal to a loudspeaker for optimized playback in a noisy environment.

* * * * *